(12) United States Patent
Sasagawa et al.

(10) Patent No.: US 8,790,961 B2
(45) Date of Patent: Jul. 29, 2014

(54) SEMICONDUCTOR DEVICE AND METHOD FOR MANUFACTURING THE SAME

(71) Applicant: Semiconductor Energy Laboratory Co., Ltd., Atsugi (JP)

(72) Inventors: Shinya Sasagawa, Chigasaki (JP); Hideomi Suzawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/716,891

(22) Filed: Dec. 17, 2012

(65) Prior Publication Data

US 2013/0161605 A1 Jun. 27, 2013

(30) Foreign Application Priority Data

Dec. 23, 2011 (JP) ................... 2011-282438
Dec. 23, 2011 (JP) ................... 2011-282511

(51) Int. Cl.
*H01L 21/00* (2006.01)
*H01L 21/16* (2006.01)
*H01L 29/78* (2006.01)
*H01L 29/66* (2006.01)

(52) U.S. Cl.
CPC .......... *H01L 29/78* (2013.01); *H01L 29/66477* (2013.01)
USPC ............. 438/104; 257/E21.411; 257/E29.242

(58) Field of Classification Search
CPC ........................... H01L 29/78; H01L 29/66477
USPC ..................... 438/104; 257/E21.411, E29.242
See application file for complete search history.

(56) References Cited

U.S. PATENT DOCUMENTS

| 5,648,662 | A | 7/1997 | Zhang et al. |
| 5,731,856 | A | 3/1998 | Kim et al. |
| 5,744,864 | A | 4/1998 | Cillessen et al. |
| 5,811,328 | A | 9/1998 | Zhang et al. |
| 6,124,155 | A | 9/2000 | Zhang et al. |
| 6,166,399 | A | 12/2000 | Zhang et al. |
| 6,294,274 | B1 | 9/2001 | Kawazoe et al. |

(Continued)

FOREIGN PATENT DOCUMENTS

| CN | 102257621 | 11/2011 |
| EP | 1737044 A | 12/2006 |

(Continued)

OTHER PUBLICATIONS

Invitation to pay additional fees (application No. PCT/JP2012/082594) dated Jan. 15, 2013.

(Continued)

*Primary Examiner* — David S Blum
(74) *Attorney, Agent, or Firm* — Eric J. Robinson; Robinson Intellectual Property Law Office, P.C.

(57) ABSTRACT

A bottom-gate transistor with a short channel length and a method for manufacturing the transistor are provided. A bottom-gate transistor with a short channel length in which portions of a source electrode and a drain electrode which are proximate to a channel formation region are thinner than other portions thereof was devised. In addition, the portions of the source electrode and the drain electrode which are proximate to the channel formation region are formed in a later step than the other portions thereof, whereby a bottom-gate transistor with a short channel length can be manufactured.

20 Claims, 17 Drawing Sheets

(56) References Cited

U.S. PATENT DOCUMENTS

| | | |
|---|---|---|
| 6,335,213 B1 | 1/2002 | Zhang et al. |
| 6,563,174 B2 | 5/2003 | Kawasaki et al. |
| 6,727,522 B1 | 4/2004 | Kawasaki et al. |
| 6,756,258 B2 | 6/2004 | Zhang et al. |
| 6,797,548 B2 | 9/2004 | Zhang et al. |
| 6,847,064 B2 | 1/2005 | Zhang et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,507,991 B2 | 3/2009 | Zhang et al. |
| 7,674,650 B2 | 3/2010 | Akimoto et al. |
| 7,732,819 B2 | 6/2010 | Akimoto et al. |
| 7,923,311 B2 | 4/2011 | Zhang et al. |
| 8,183,099 B2 | 5/2012 | Sakata |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062344 A1 | 3/2008 | Yoshimoto |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0159639 A1 | 6/2010 | Sakata |
| 2011/0092017 A1 | 4/2011 | Akimoto et al. |
| 2011/0101362 A1 | 5/2011 | Zhang et al. |
| 2011/0114943 A1 | 5/2011 | Yamazaki et al. |
| 2011/0156022 A1 | 6/2011 | Yamazaki et al. |
| 2011/0180796 A1 | 7/2011 | Yamazaki et al. |
| 2011/0193080 A1 | 8/2011 | Yamazaki et al. |
| 2012/0223307 A1 | 9/2012 | Sakata |
| 2013/0140554 A1 | 6/2013 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-045354 A | 2/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-166030 A | 7/2010 |
| JP | 2011-124556 A | 6/2011 |
| JP | 2011-238333 A | 11/2011 |
| KR | 2011-0104057 A | 9/2011 |
| KR | 2012-0084783 A | 7/2012 |
| TW | 201041049 | 11/2010 |
| TW | 201138105 | 11/2011 |
| WO | WO-2004/114391 | 12/2004 |
| WO | WO-2010/071034 | 6/2010 |
| WO | WO-2011/058866 | 5/2011 |

OTHER PUBLICATIONS

Kaneko.K et al., "Highly Reliable BEOL-Transistor with Oxygen-controlled InGaZnO and Gate/Drain Offset Design for High/Low Voltage Bridging I/O Operations,", IEDM 11: Technical Digest of International Electron Devices Meeting, Dec. 1, 2011, pp. 155-158.

Fortunato.E et al., "Wide-Bandgap High-Mobility ZnO Thin-Film Transistors Produced at Room Temperature,", Appl. Phys. Lett.

(56) References Cited

OTHER PUBLICATIONS (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) Jun. 17, 1996, vol. 68, No. 25, pp. 3650-3652.

Nakamura.M et al., "The phase relations in the In2O3-Ga2ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO), (M=In, Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3-In2O3-ZnO) TFT,", SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Display,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase,",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09: Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

(56) References Cited

OTHER PUBLICATIONS

Ohara.H et al., "21.3:4.0 In. QVGA AMOLED Display Using In-Ga-Zn-Oxide TFTS With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3-A2O3-BO Systems [A; Fe, Ga, or Al; B; Mg, Mn, Fe, Ni, Cu, or Zn] at Temperatures Over 1000°C,", Journal of Solid State Chemistry, 1985, vol. 60, pp. 382-384.

Kitzerow.H et al. "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev, B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S at al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

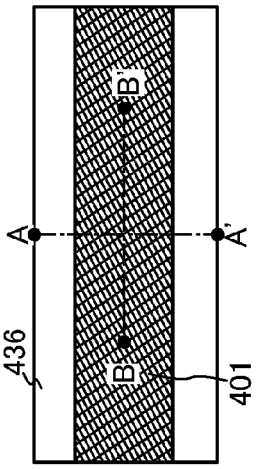
FIG. 2A1  FIG. 2A2  FIG. 2A3
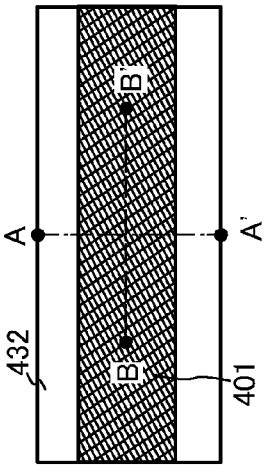
FIG. 2B1  FIG. 2B2  FIG. 2B3
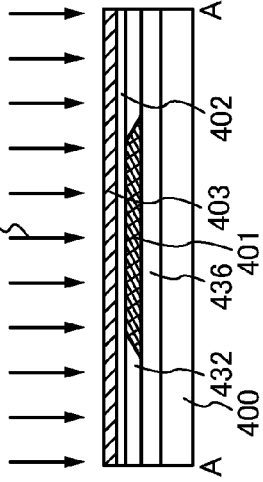
FIG. 2C1  FIG. 2C2  FIG. 2C3

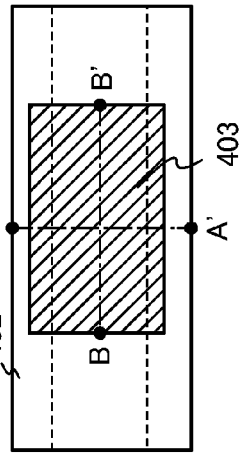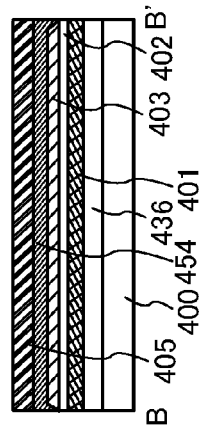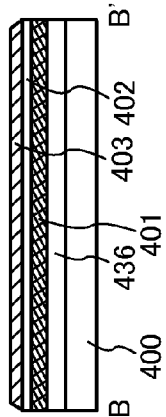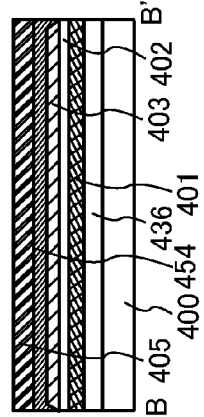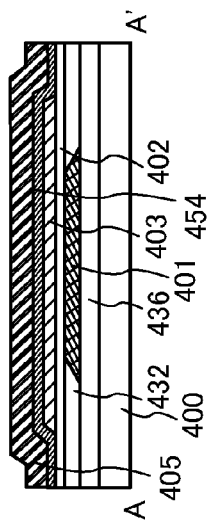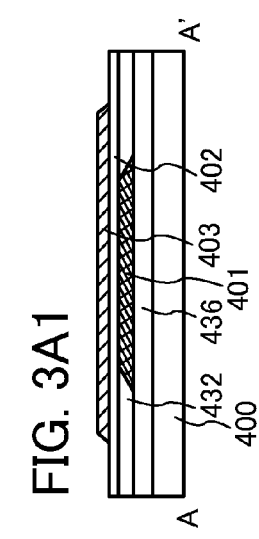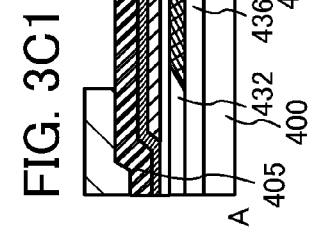

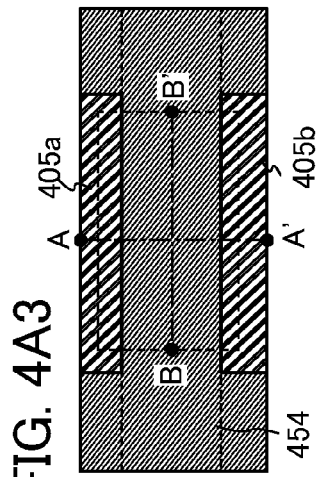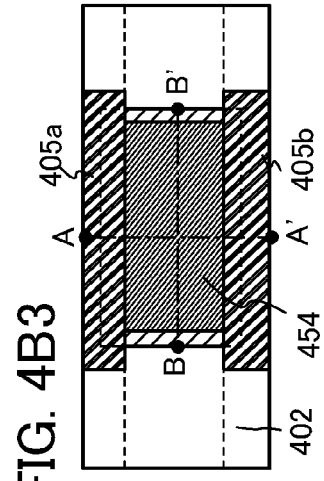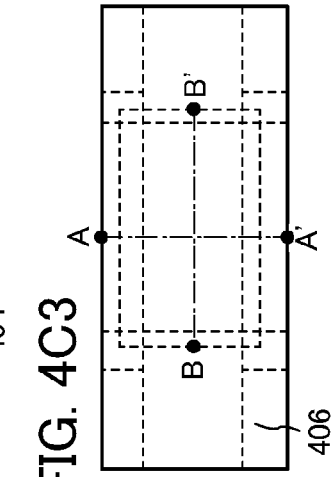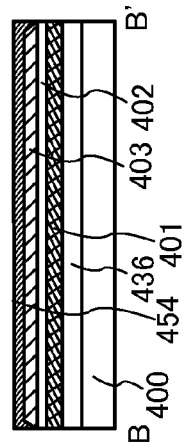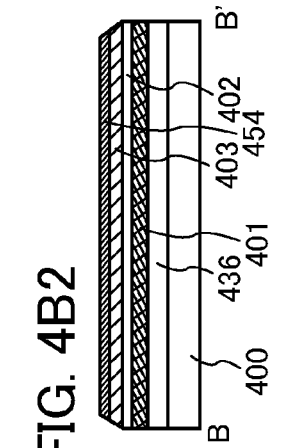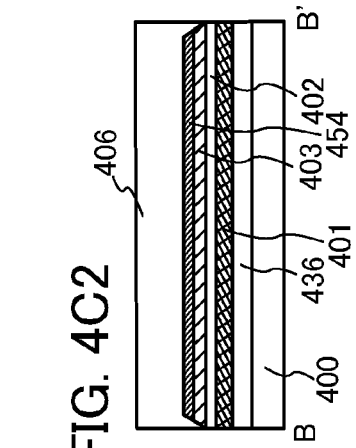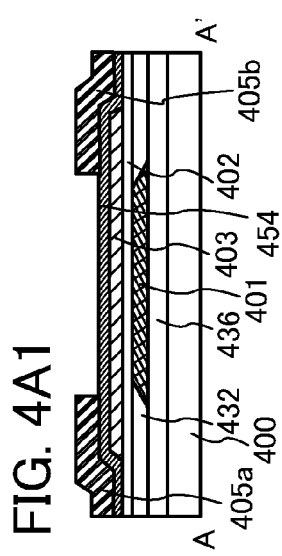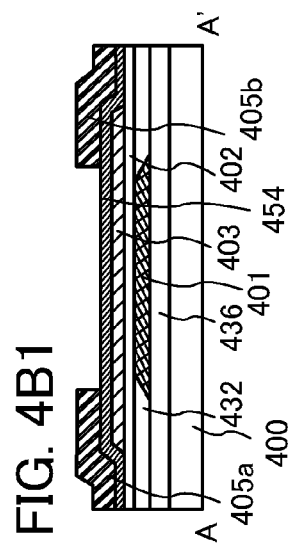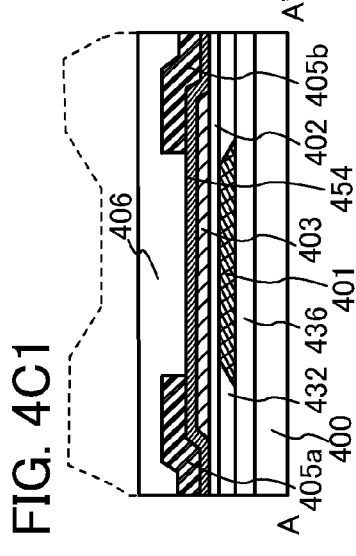

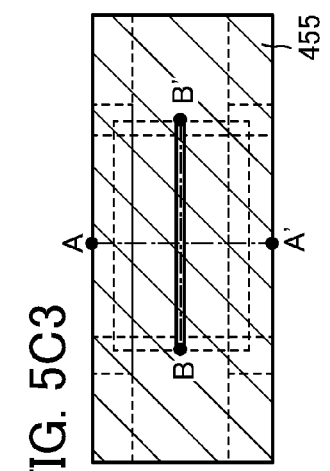
FIG. 5A3
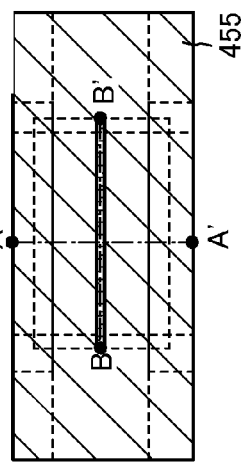
FIG. 5B3
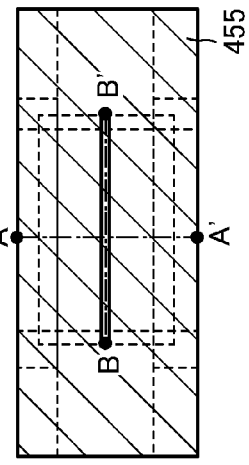
FIG. 5C3
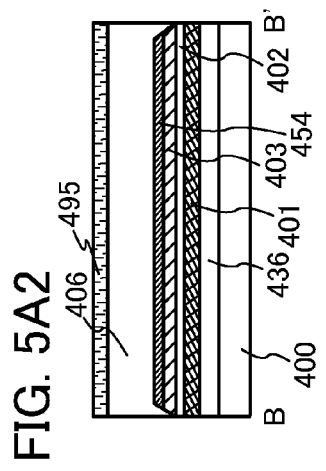
FIG. 5A2
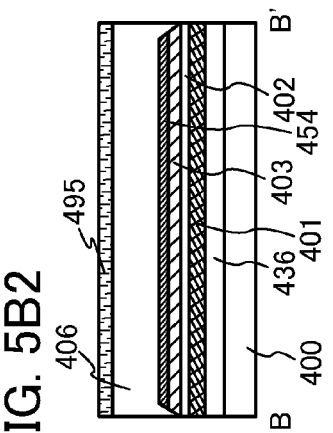
FIG. 5B2
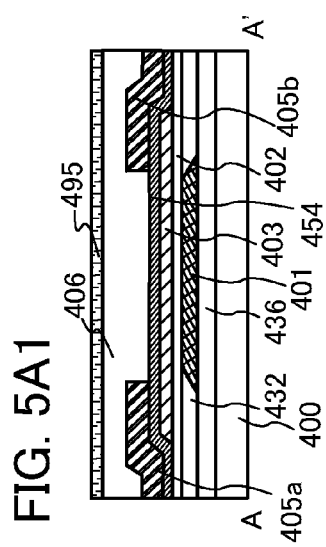
FIG. 5A1
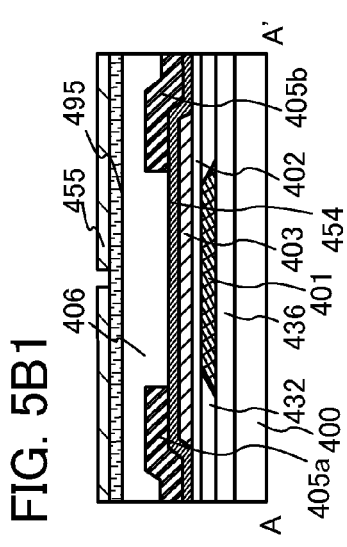
FIG. 5B1
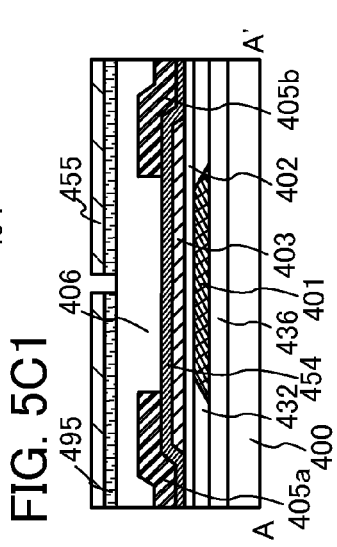
FIG. 5C1

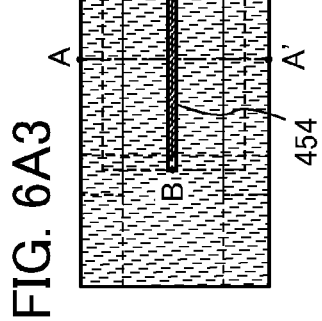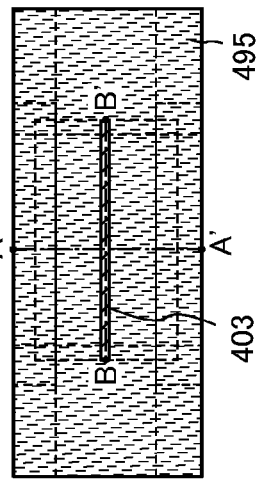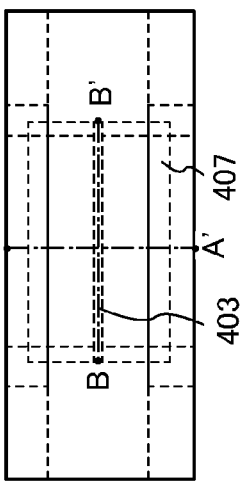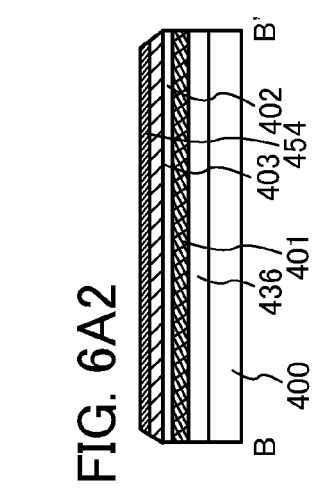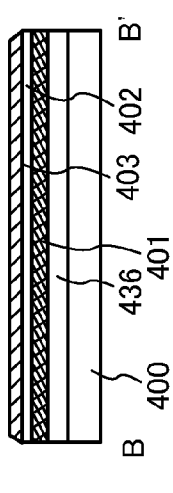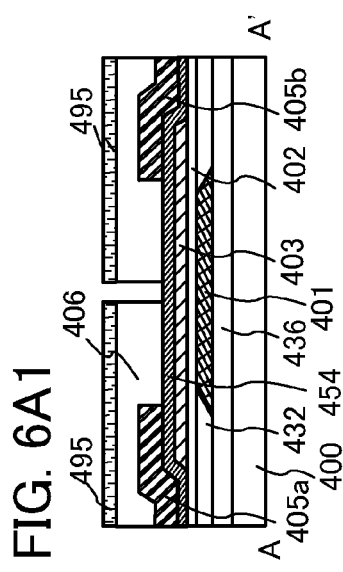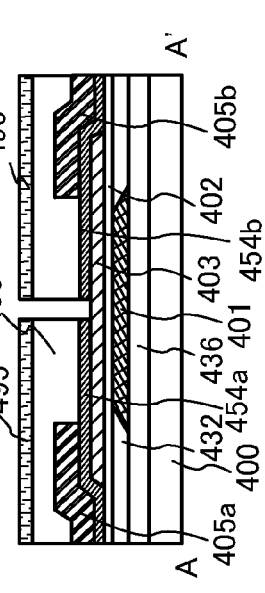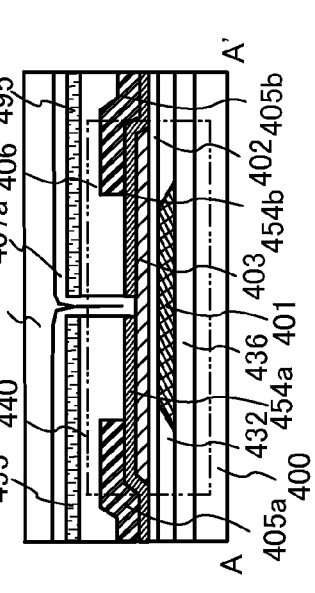

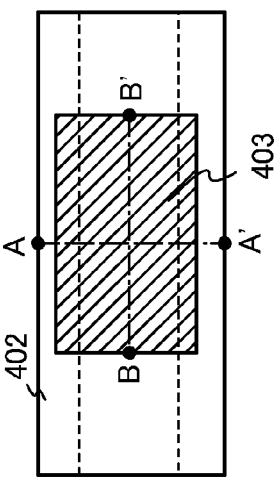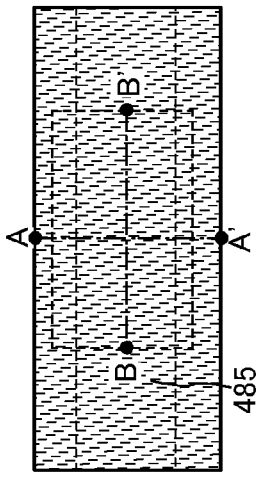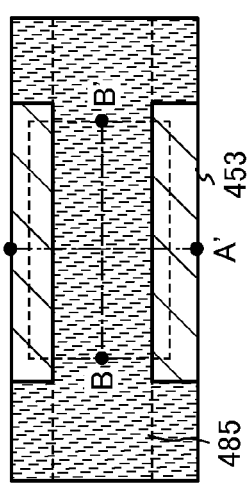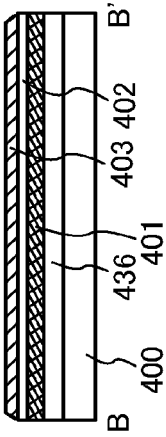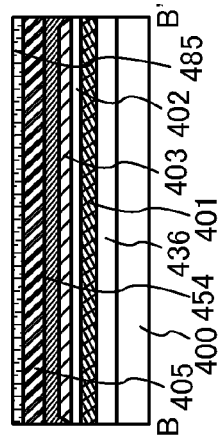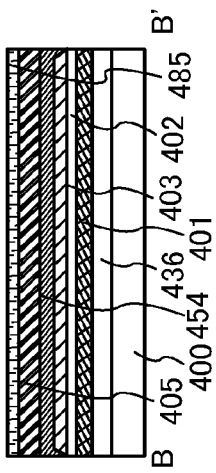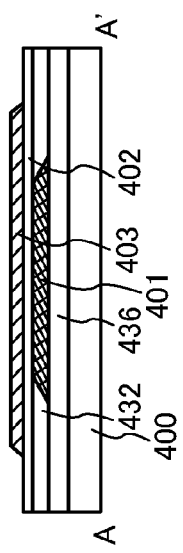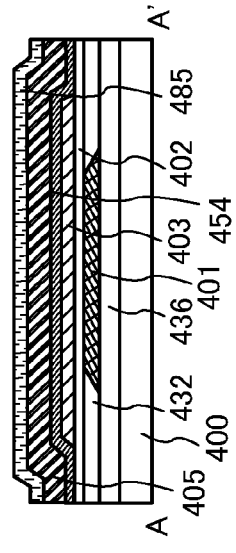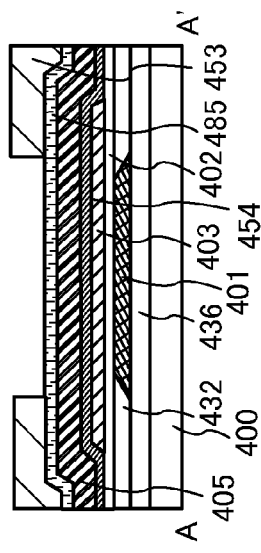

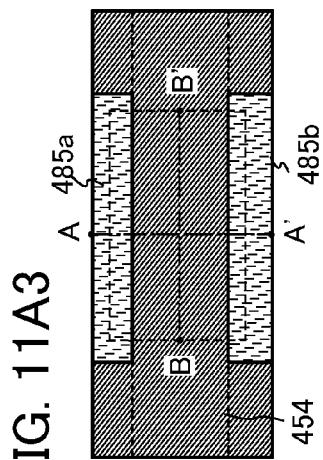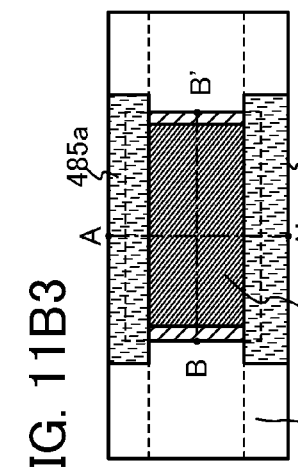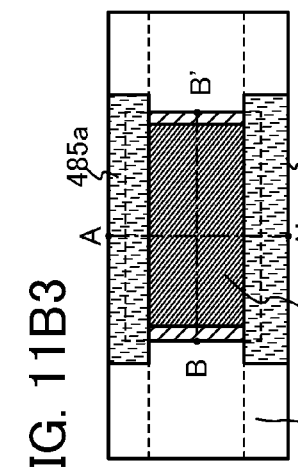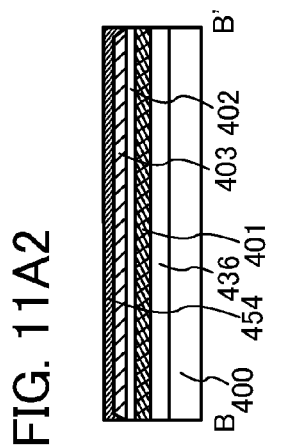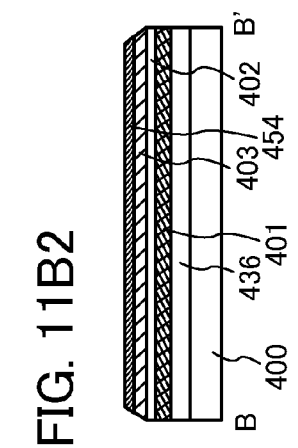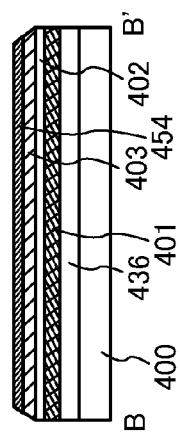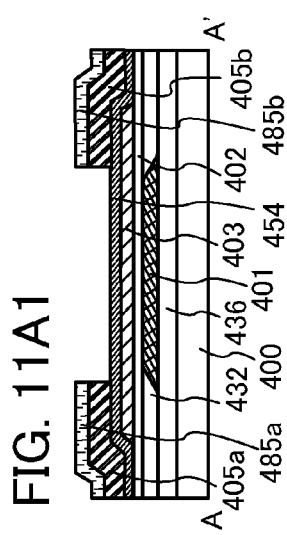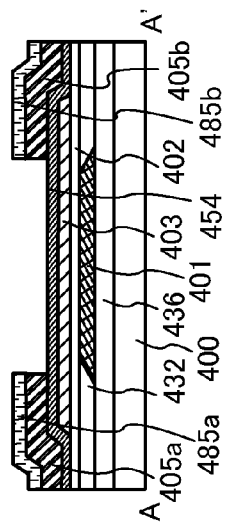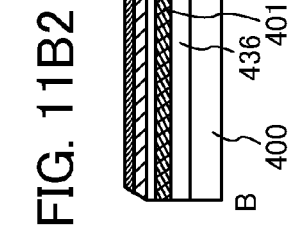

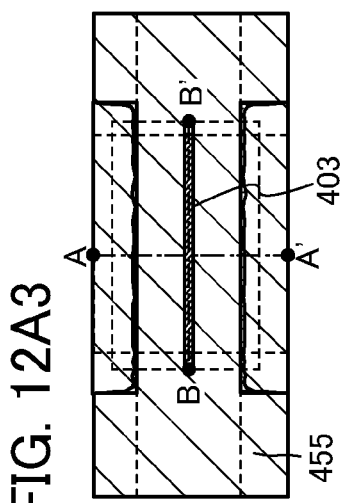
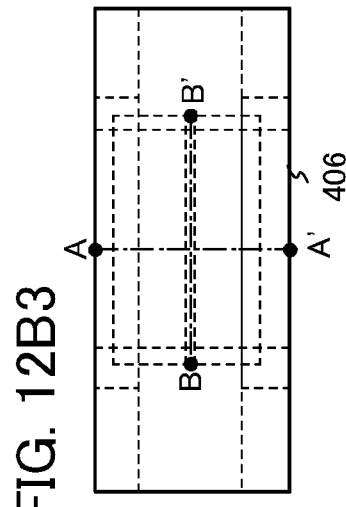
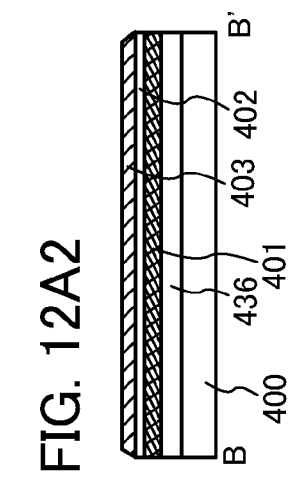
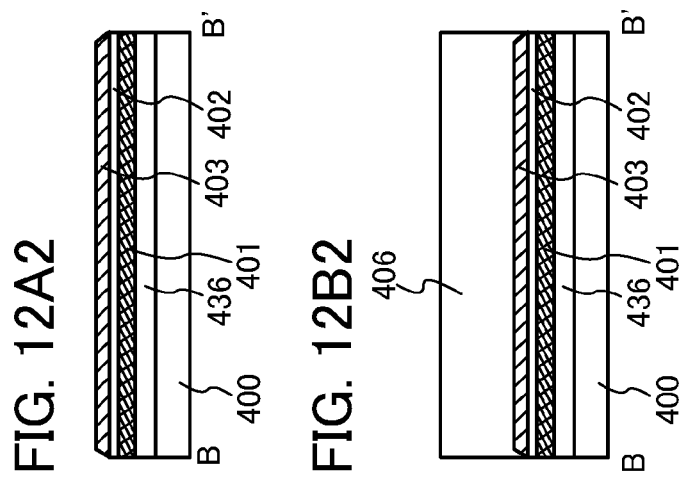
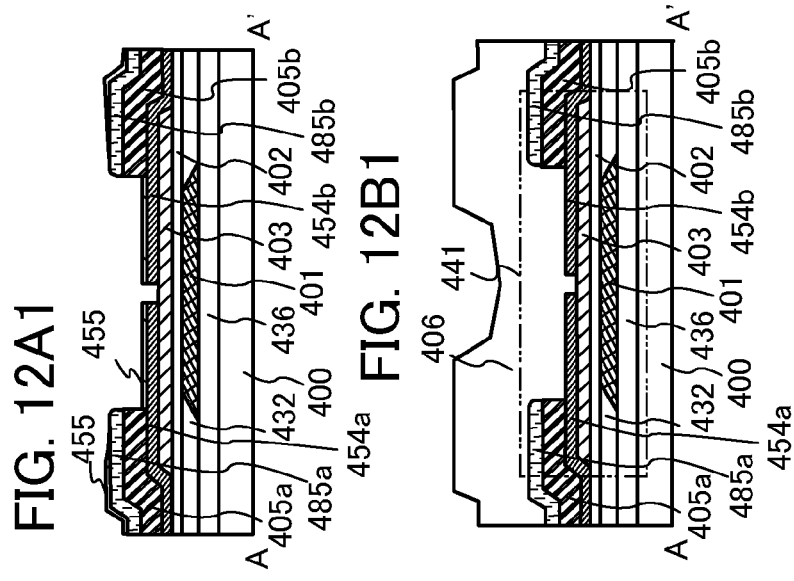

SEMICONDUCTOR DEVICE AND METHOD FOR MANUFACTURING THE SAME

TECHNICAL FIELD

The present invention relates to a semiconductor device typified by a transistor and a method for manufacturing the semiconductor device.

BACKGROUND ART

Transistors in which a semiconductor material is deposited over a substrate having an insulating surface to be used as an active layer (hereinafter referred to as deposited-film transistors) have been researched. A silicon-based semiconductor material such as amorphous silicon has been conventionally used as an active layer; however, attention is focused in recent years on research on transistors in which an oxide semiconductor material is used as an active layer. This is because a transistor in which an oxide semiconductor material is used as an active layer (hereinafter referred to as an oxide semiconductor transistor) has higher on-state current and lower off-state current than a transistor in which amorphous silicon is used as an active layer.

Further, there have been attempts to develop a semiconductor device which functions as a memory or the like by forming an oxide semiconductor transistor having the above features in a layer different from a transistor including single crystal silicon, and the like (Patent Document 1 and Non-Patent Document 1). In the structure of such a semiconductor device, the transistor in the upper layer is preferably a bottom-gate transistor. This is because a wiring which electrically connects the transistor in the lower layer can serve also as a gate electrode of the transistor in the upper layer.

REFERENCES

Patent Document

[Patent Document 1] Japanese Published Patent Application No. 2011-238333

Non-Patent Document

[Non-Patent Document 1] K. Kaneko et al., "Highly Reliable BEOL-Transistor with Oxygen-controlled InGaZnO and Gate/Drain Offset Design for High/Low Voltage Bridging I/O Operations", IEDM 2011, pp. 155-158.

DISCLOSURE OF INVENTION

In the above semiconductor device, which includes a plurality of transistors in a plurality of layers, the bottom-gate transistor formed in the upper layer is preferably a deposited-film transistor. This is because an active layer can be easily formed by deposition, which facilitates manufacture of the semiconductor device.

Conventional semiconductor devices which include a plurality of transistors in a plurality of layers and in which a bottom-gate transistor is formed in the upper layer are easy to manufacture, but do not have sufficient performance capabilities as semiconductor devices. This is because the bottom-gate transistor in the upper layer does not have sufficient electric characteristics. For example, in a memory using a semiconductor device which includes a plurality of transistors in a plurality of layers, a transistor which performs writing to the memory does not have sufficient writing capability or the like when the transistor is a deposited-film transistor. This is because the bottom-gate transistor in the upper layer does not have sufficient electric characteristics, particularly because the on-state current is lower than that of a transistor in which bulk silicon is used as an active layer. Therefore, it is necessary to increase the on-state current of the deposited-film transistor. One method for achieving this is to use the bottom-gate transistor whose channel length is reduced (for example, to about 30 nm). Note that a photolithography process using an electron beam is necessary for reducing the channel length to less than 30 nm.

In order to reduce the channel length of a bottom-gate transistor whose source electrode and drain electrode are formed by separating one conductive layer using a photolithography process, the thickness of a resist needs to be less than or equal to the desired channel length. Meanwhile, the thickness of the resist is reduced during the etching step of the conductive layer. Therefore, the thickness of the conductive layer needs to be set such that the conductive layer can be separated before the resist is removed in the etching step.

On the other hand, there is a limitation on reduction in the thickness of the conductive layer because the source electrode and the drain electrode of the transistor preferably have low electric resistance.

As described above, it is difficult to reduce the channel length of the bottom-gate transistor while suppressing the electric resistance between the source electrode and the drain electrode.

An object of one embodiment of the present invention is to provide a bottom-gate transistor with a short channel length. Another object is to provide a method for manufacturing a bottom-gate transistor with a short channel length.

The inventors have focused on the structure of the source electrode and the drain electrode of the bottom-gate transistor. Thus, the inventors have devised a structure in which portions of the source electrode and the drain electrode which are proximate to a channel formation region are thinner than other portions thereof.

The inventors have also devised a method in which the portions of the source electrode and the drain electrode which are proximate to the channel formation region are formed in a later step than the other portions thereof.

Further, the inventors focused on the following phenomenon: steps which are caused between a portion proximate to the channel formation region and the other portions by the formation of the other portions (i.e., portions other than the portions proximate to the channel formation region) of the source electrode and the drain electrode cannot be covered with a resist at the time of the formation of the portions of the source electrode and the drain electrode which are proximate to the channel formation region. Thus, the inventors have devised a method for manufacturing a bottom-gate transistor with a short channel length, which includes the steps of: covering the steps with an insulating layer, planarizing the insulating layer, forming a hard mask layer over the planarized insulating layer, and separating the portion proximate to the channel formation region with the hard mask layer.

Specifically, one embodiment of the present invention is a method for manufacturing a semiconductor device, including the steps of: forming a gate electrode layer over an insulating surface; forming a gate insulating layer on and in contact with the gate electrode layer; forming an oxide semiconductor layer overlapping with the gate electrode layer on and in contact with the gate insulating layer; forming a conductive layer covering the oxide semiconductor layer on and in contact with the oxide semiconductor layer; forming, on and in contact with the conductive layer, a first low-resistance material layer and a second low-resistance material layer apart from each other with the gate electrode layer provided therebetween; forming a first protective layer on and in contact with the first low-resistance material layer, the second low-resistance material layer, and the conductive layer; planarizing the first protective layer; forming a hard mask layer on and in contact with the planarized first protective layer; forming, on a surface of the hard mask layer, a resist pattern including an opening pattern portion in a region that is between the first low-resistance material layer and the second low-resistance material layer and overlaps with the oxide semiconductor layer; etching the hard mask layer using the resist pattern to form an opening pattern; etching the first protective layer using the hard mask layer including the opening pattern as a mask until the conductive layer is exposed; etching the conductive layer using the hard mask layer and the first protective layer including the opening pattern as masks to separate the conductive layer into a first conductive layer and a second conductive layer; and filling an opening in the first protective layer with a second protective layer.

The steps between the portion proximate to the channel formation region and the other portions are planarized with an insulating layer, and then, a hard mask layer is formed and a resist for forming an opening is applied on the hard mask layer. Since the surface on which the resist is to be applied is flat, the resist can be uniformly formed, which prevents a region which cannot be covered with the resist from being formed and enables the resist to be thinly and uniformly formed. Thus, an opening pattern with a small line width can be formed with the resist over the hard mask layer.

As described above, a transistor with a short channel length can be formed by processing a conductive layer with the use of a hard mask layer. Even when the resist is removed during the processing, a problem in that processing cannot be performed after the removal is prevented owing to the hard mask layer. This is because the hard mask layer serves as a mask for the processing of the first protective layer and the conductive layer. Note that the hard mask layer can be formed using a film which is not easily etched under conditions for etching the first protective layer and the conductive layer.

Through the above steps, the conductive layer for forming the source electrode and the drain electrode can be provided with an opening with a minute pattern. Thus, a bottom-gate transistor with a short channel length can be manufactured.

Another embodiment of the present invention is a method for manufacturing a semiconductor device, including the steps of: forming a gate electrode layer over an insulating surface; forming a gate insulating layer on and in contact with the gate electrode layer; forming an oxide semiconductor layer overlapping with the gate electrode layer on and in contact with the gate insulating layer; forming a conductive layer covering the oxide semiconductor layer on and in contact with the oxide semiconductor layer; forming a low-resistance material layer on and in contact with the conductive layer; forming a wiring protective layer on and in contact with the low-resistance material layer; forming a first wiring protective layer and a second wiring protective layer apart from each other with the gate electrode layer provided therebetween by processing the wiring protective layer; forming a first low-resistance material layer and a second low-resistance material layer apart from each other with the gate electrode layer provided therebetween by processing the low-resistance material layer, the first low-resistance material layer being in contact with the first wiring protective layer and the second low-resistance material layer being in contact with the second wiring protective layer; forming a resist pattern including an opening pattern portion in a region that is between the first low-resistance material layer and the second low-resistance material layer and overlaps with the oxide semiconductor layer; etching the conductive layer using the resist pattern to separate the conductive layer into a first conductive layer and a second conductive layer; and filling an opening in the conductive layer with a protective layer.

Through the above steps, the conductive layer for forming the source electrode and the drain electrode can be provided with an opening with a minute pattern without the low-resistance material layer being removed during the processing of the conductive layer. Thus, a bottom-gate transistor with a short channel length can be manufactured.

In the method for manufacturing a semiconductor device according to one embodiment of the present invention, the thickness of the low-resistance material layer is not reduced and the surface of the low-resistance material layer is not damaged during the processing of the conductive layer for forming the source electrode and the drain electrode. Therefore, the wiring resistance of the low-resistance material layer is not increased. The low-resistance material layer can be used as a wiring for electrically connecting the transistor to another semiconductor element. Thus, an integrated circuit which includes a semiconductor device manufactured by the method can operate at high speed because wiring delay due to high wiring resistance hardly occurs.

Another embodiment of the present invention is a semiconductor device including a gate electrode layer; a gate insulating layer on and in contact with the gate electrode layer; an oxide semiconductor layer being on and in contact with the gate insulating layer and overlapping with the gate electrode layer; a first conductive layer and a second conductive layer provided on and in contact with the oxide semiconductor layer apart from each other with the gate electrode layer provided therebetween; a first low-resistance material layer on and in contact with the first conductive layer; a second low-resistance material layer on and in contact with the second conductive layer; a first protective layer on and in contact with the first conductive layer, the first low-resistance material layer, the second conductive layer, and the second low-resistance material layer; and a second protective layer in contact with a part of the oxide semiconductor layer. In the semiconductor device, a distance between the first conductive layer and the second conductive layer is shorter than a distance between the first low-resistance material layer and the second low-resistance material layer. The first conductive layer and the first low-resistance material layer serve as a source electrode and the second conductive layer and the second low-resistance material layer serve as a drain electrode.

When the above structure is applied to a bottom-gate transistor including an oxide semiconductor layer, the transistor can have a short channel length and thus can have high on-state current. Further, since an oxide semiconductor has higher electron mobility than amorphous silicon, a semiconductor device with high on-state current can be provided.

Another embodiment of the present invention is a semiconductor device including a gate electrode layer; a gate insulating layer on and in contact with the gate electrode layer; an oxide semiconductor layer being on and in contact with the gate insulating layer and overlapping with the gate electrode layer; a first conductive layer and a second conductive layer provided on and in contact with the oxide semiconductor layer apart from each other with the gate electrode layer provided therebetween; a first low-resistance material layer on and in contact with the first conductive layer; a second low-resistance material layer on and in contact with the second conductive layer; a first wiring protective layer on and in contact with the first low-resistance material layer; a second wiring protective layer on and in contact with the second low-resistance material layer; and a protective layer on and in contact with the first conductive layer, the first wiring protective layer, the second conductive layer, and the second wiring protective layer and in contact with a part of the oxide semiconductor layer. In the semiconductor device, a distance between the first conductive layer and the second conductive layer is shorter than a distance between the first low-resistance material layer and the second low-resistance material layer. The first conductive layer and the first low-resistance material layer serve as a source electrode and the second conductive layer and the second low-resistance material layer serve as a drain electrode.

When the above structure is applied to a bottom-gate transistor including an oxide semiconductor layer, the transistor can have a short channel length and thus can have high on-state current. Further, since an oxide semiconductor has higher electron mobility than amorphous silicon, a semiconductor device with high on-state current can be provided.

The ends of the wiring protective layers on the channel side might be rounded through the processing for forming the conductive layers. In that case, the coverage with the protective layer can be favorable as compared with the case where the ends are not rounded. The protective layer functions as a passivation film; thus, better coverage with the protective layer enables moisture or the like to be further prevented from entering from the outside. This is particularly effective in a transistor using an oxide semiconductor, whose electric characteristics are easily affected by moisture or the like which enters from the outside.

In any of the above semiconductor devices, the gate insulating layer is preferably flat.

Planarization of a base insulating layer and the gate electrode layer can prevent non-coverage of the oxide semiconductor layer due to a step caused by the gate electrode layer. The planarization is particularly effective when the thickness of the oxide semiconductor layer is greater than or equal to 5 nm and less than or equal to 30 nm.

In any of the above semiconductor devices, a width of the oxide semiconductor layer in a channel length direction is preferably larger than a width of the gate electrode layer in the channel length direction.

In that case, the oxide semiconductor layer overlaps with the gate electrode layer in a large area, which enables the oxide semiconductor layer to be supplied with oxygen more easily from an insulating layer below the oxide semiconductor layer. As a result, the initial electric characteristics (e.g., threshold voltage) and reliability in electric characteristics (e.g., threshold voltage) of the transistor can be improved.

Moreover, oxygen vacancies are likely to be formed in the end of an island-shaped oxide semiconductor layer, and therefore carriers are more likely to be generated than in other regions thereof. Local generation of carriers in the oxide semiconductor layer, which is an active layer, causes degradation of electric characteristics (e.g., threshold voltage) of the transistor.

Suppose that the width of the oxide semiconductor layer in the channel length direction is smaller than the width of the gate electrode layer in the channel length direction, that is, the end of the island-shaped oxide semiconductor layer is on the inner side than the end of the gate electrode layer, an electric field is concentrated on the end of the island-shaped oxide semiconductor layer upon application of a voltage between the gate electrode layer and the source electrode. Concentration of an electric field on the end of the island-shaped oxide semiconductor layer, where carriers are likely to be generated, leads to degradation of electric characteristics (e.g., threshold voltage) of the transistor. On the other hand, when the width of the oxide semiconductor layer in the channel length direction is larger than the width of the gate electrode layer in the channel length direction as in one embodiment of the present invention, the end of the island-shaped oxide semiconductor layer is on the outer side than the end of the gate electrode layer; thus, an electric field is not concentrated on the end of the island-shaped oxide semiconductor layer upon application of a voltage between the gate electrode layer and the source electrode. This can suppress degradation of electric characteristics (e.g., threshold voltage) of the transistor.

According to one embodiment of the present invention, a bottom-gate transistor whose channel length is short (e.g., 30 nm) and in which an oxide semiconductor layer is used as an active layer can be manufactured. Further, a semiconductor device including the transistor as a component can be provided.

BRIEF DESCRIPTION OF DRAWINGS

FIGS. 2A-1 to 2A-3, 2B-1 to 2B-3, and 2C-1 to 2C-3 are plan views and cross-sectional views illustrating one embodiment of the present invention.

FIGS. 3A-1 to 3A-3, 3B-1 to 3B-3, and 3C-1 to 3C-3 are plan views and cross-sectional views illustrating one embodiment of the present invention.

FIGS. 4A-1 to 4A-3, 4B-1 to 4B-3, and 4C-1 to 4C-3 are plan views and cross-sectional views illustrating one embodiment of the present invention.

FIGS. 5A-1 to 5A-3, 5B-1 to 5B-3, and 5C-1 to 5C-3 are plan views and cross-sectional views illustrating one embodiment of the present invention.

FIGS. 6A-1 to 6A-3, 6B-1 to 6B-3, and 6C-1 to 6C-3 are plan views and cross-sectional views illustrating one embodiment of the present invention.

FIGS. 10A-1 to 10A-3, 10B-1 to 10B-3, and 10C-1 to 10C-3 are plan views and cross-sectional views illustrating one embodiment of the present invention.

FIGS. 11A-1 to 11A-3, 11B-1 to 11B-3, and 11C-1 to 11C-3 are plan views and cross-sectional views illustrating one embodiment of the present invention.

FIGS. 12A-1 to 12A-3 and 12B-1 to 12B-3 are plan views and cross-sectional views illustrating one embodiment of the present invention.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Figure 1A:
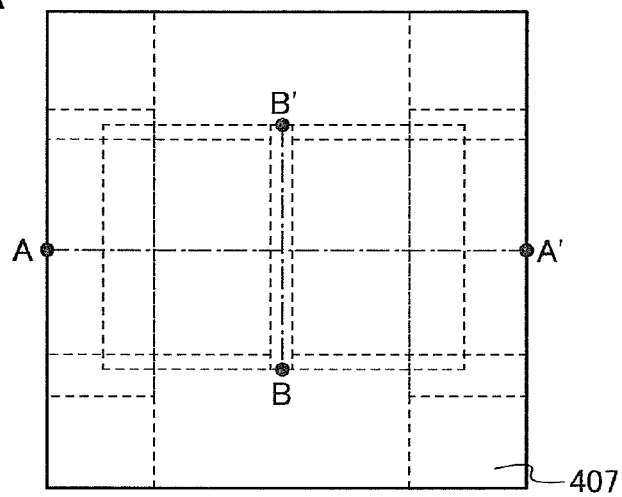
FIGS. 1A to 1C are a plan view and cross-sectional views illustrating one embodiment of the present invention.
Figure 1B:
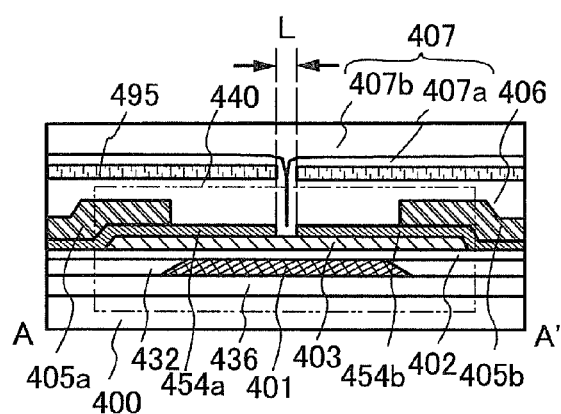
Figure 1C:
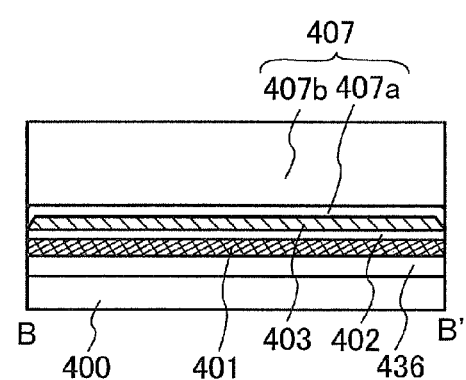

In this embodiment, one embodiment of a semiconductor device which can be manufactured according to the present invention will be described with reference to FIGS. 1A to 1C. FIG. 1A is a plan view of a transistor 440, FIG. 1B is a cross-sectional view taken along line A-A' in FIG. 1A, and FIG. 1C is a cross-sectional view taken along line B-B' in FIG. 1A. A channel length L of the transistor 440 is greater than or equal to 20 nm and less than or equal to 100 nm, preferably greater than or equal to 20 nm and less than or equal to 50 nm, more preferably greater than or equal to 20 nm and less than or equal to 30 nm. In this embodiment, the channel length L is about 30 nm.

The transistor 440 in FIGS. 1A to 1C is a bottom-gate transistor. The transistor 440 illustrated in FIGS. 1A to 1C includes, over a base insulating layer 436 formed over a surface of a substrate 400, a gate electrode layer 401 provided so as to be buried in an insulating layer 432, a gate insulating layer 402 over the gate electrode layer 401, an oxide semiconductor layer 403 over the gate insulating layer 402, a first conductive layer 454a and a second conductive layer 454b over the oxide semiconductor layer 403, a first low-resistance material layer 405a on and in contact with the first conductive layer 454a, a second low-resistance material layer 405b on and in contact with the second conductive layer 454b, a first protective layer 406 in contact with the first low-resistance material layer 405a, the second low-resistance material layer 405b, the first conductive layer 454a, and the second conductive layer 454b, a hard mask layer 495 in contact with the first protective layer 406, and a second protective layer 407 over the hard mask layer 495.

First, components will be described below.
<Components of the Semiconductor Device>
(Substrate and Base Insulating Layer)

As the substrate 400, a substrate having an insulating surface can be used; a substrate having at least heat resistance high enough to withstand heat treatment in a later step is preferable. For example, a glass substrate, a ceramic substrate, a quartz substrate, a sapphire substrate, or the like can be used as the substrate 400. A single crystal semiconductor substrate or a polycrystalline semiconductor substrate made of silicon, silicon carbide, or the like; a compound semiconductor substrate made of silicon germanium or the like; an SOI substrate; or the like can be used as the substrate 400, or the substrate provided with a semiconductor element can be used as the substrate 400. Note that the concentration of impurities such as hydrogen or water in the substrate 400 is preferably low. This is for preventing diffusion of hydrogen or water into the oxide semiconductor layer 403 so as to prevent degradation of the electric characteristics of the semiconductor device.

As the base insulating layer 436, an oxide insulating layer of silicon oxide, silicon oxynitride, aluminum oxide, aluminum oxynitride, or the like or a nitride insulating layer of silicon nitride, silicon nitride oxide, aluminum nitride, aluminum nitride oxide, or the like can be used, for example.

(Gate Electrode Layer)

The gate electrode layer 401 can be formed using a metal material such as molybdenum, titanium, tungsten, aluminum, or copper, for example. Alternatively, a semiconductor layer typified by a polycrystalline silicon layer doped with an impurity element such as phosphorus, or a silicide layer such as a nickel silicide layer may be used as the gate electrode layer 401. The gate electrode layer 401 may have either a single-layer structure or a stacked-layer structure.
(Gate Insulating Layer)

The gate insulating layer 402 can be formed using silicon oxide, silicon oxynitride, silicon nitride, or the like. The gate insulating layer 402 is preferably a silicon oxide layer containing oxygen in a proportion higher than that in the stoichiometric composition. The gate insulating layer 402 may be a single layer or a stack of two layers formed using any of the above materials. For example, silicon nitride and silicon oxynitride, or silicon nitride and silicon oxide can be used.
(Source Electrode Layer and Drain Electrode Layer)

One of the source electrode layer and the drain electrode layer includes the first conductive layer 454a and the first low-resistance material layer 405a, and the other of the source electrode layer and the drain electrode layer includes the second conductive layer 454b and the second low-resistance material layer 405b. The first conductive layer 454a and the second conductive layer 454b can be formed using a metal such as tungsten or molybdenum. Tungsten is especially preferred because the ratio of the etching rate of the first conductive layer 454a and the second conductive layer 454b to that of the first protective layer 406 can be increased. A stack of aluminum and titanium, copper, or the like can be used for the first low-resistance material layer 405a and the second low-resistance material layer 405b. The stack of aluminum and titanium may be titanium, aluminum, and titanium stacked in this order. In the case of using copper for the first low-resistance material layer 405a and the second low-resistance material layer 405b, titanium nitride or the like is preferably provided to prevent diffusion of copper into an adjacent layer.
(Semiconductor Layer)

A semiconductor that has a band gap wider than at least that of silicon, 1.1 eV, can be used for a semiconductor layer of a transistor according to one embodiment of the present invention; an oxide semiconductor is preferably used. In this embodiment, the case where the oxide semiconductor layer 403 is used as the semiconductor layer is described.

The thickness of the oxide semiconductor layer 403 is greater than or equal to 5 nm and less than or equal to 100 nm, preferably greater than or equal to 5 nm and less than or equal to 30 nm. The thickness is set such that the channel length of the transistor is reduced while short-channel effect is suppressed.

A material that can be used as the oxide semiconductor contains at least indium (In). In particular, In and zinc (Zn) are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following can be used: indium oxide, tin oxide, zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

A material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_2SnO_5(ZnO)_n$ (n>0, where n is an integer) may be used as the oxide semiconductor.

As the oxide semiconductor, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used as the oxide semiconductor containing indium depending on needed semiconductor characteristics (e.g., electric characteristics such as mobility and threshold voltage, and variation in the electric characteristics). In order to obtain the needed semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

The oxide semiconductor layer 403 is in a single crystal state, a polycrystalline (also referred to as polycrystal) state, an amorphous state, or the like.

It is preferable that the oxide semiconductor layer 403 be highly purified so as to hardly contain impurities such as copper, aluminum, or chlorine. In the process for manufacturing the transistor, steps in which these impurities are not mixed or attached to the surface of the oxide semiconductor layer 403 are preferably selected as appropriate. In the case where the impurities are attached to the surface of the oxide semiconductor layer 403, the impurities on the surface of the oxide semiconductor layer 403 are preferably removed by exposure to oxalic acid, dilute hydrofluoric acid, or the like or by plasma treatment (such as $N_2O$ plasma treatment). Specifically, the copper concentration in the oxide semiconductor is lower than or equal to $1 \times 10^{18}$ atoms/cm$^3$, preferably lower than or equal to $1 \times 10^{17}$ atoms/cm$^3$. In addition, the aluminum concentration in the oxide semiconductor is lower than or equal to $1 \times 10^{18}$ atoms/cm$^3$. Further, the chlorine concentration in the oxide semiconductor is lower than or equal to $2 \times 10^{18}$ atoms/cm$^3$.

The oxide semiconductor immediately after being deposited is preferably in a supersaturated state in which the proportion of oxygen is higher than that in the stoichiometric composition. For example, in the case where the oxide semiconductor is deposited using a sputtering method, the deposition is preferably performed under the condition where the proportion of oxygen in a deposition gas is high, in particular, in an oxygen atmosphere (oxygen gas: 100%). When the deposition is performed under the condition where the proportion of oxygen in the deposition gas is high, particularly in a 100% oxygen gas atmosphere, release of Zn from the film can be suppressed even at a deposition temperature higher than or equal to 300° C., for example.

The oxide semiconductor is preferably supersaturated with oxygen by sufficient removal of impurities such as hydrogen followed by sufficient supply with oxygen. Specifically, the hydrogen concentration in the oxide semiconductor is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. Note that the above hydrogen concentration in the oxide semiconductor is measured by secondary ion mass spectrometry (SIMS).

(Protective Layer)

The first protective layer 406 has a function of protecting the oxide semiconductor layer 403 from entry of moisture or the like from the outside. The first protective layer 406 can be formed using a silicon oxide film, a silicon oxynitride film, or an aluminum oxide film. The first protective layer 406 is preferably formed using a silicon oxide film, a silicon oxynitride film, or an aluminum oxide film containing much oxygen. In order to make the first protective layer contain much excess oxygen, oxygen may be added as appropriate to the first protective layer by an ion implantation method, an ion doping method, or plasma treatment.

The second protective layer 407 has a function of protecting the oxide semiconductor layer 403 from entry of moisture or the like from the outside. The second protective layer 407 can be formed using a silicon oxide film, a silicon oxynitride film, or an aluminum oxide film. The second protective layer 407 is preferably formed using a silicon oxide film, a silicon oxynitride film, or an aluminum oxide film containing much oxygen. Alternatively, the second protective layer 407 may include two layers: a third protective layer 407a and a fourth protective layer 407b. The third protective layer 407a is formed in contact with the oxide semiconductor. The third protective layer 407a can be formed using an oxide semiconductor film containing gallium (Ga), a silicon oxide film, a silicon oxynitride film, or an aluminum oxide film which is deposited with conditions set as appropriate so as to contain much oxygen. The fourth protective layer 407b is formed in contact with the third protective layer 407a. The fourth protective layer 407b can be formed using a silicon oxide film, a silicon oxynitride film, or an aluminum oxide film containing much oxygen. In order to make the second protective layer contain much excess oxygen, oxygen may be added as appropriate to the second protective layer by an ion implantation method, an ion doping method, or plasma treatment.

(Hard Mask Layer)

The hard mask layer 495 is preferably a film that is not easily etched under conditions for etching the first protective layer 406. This is because the hard mask layer 495 is used as a mask in the etching of the first protective layer 406. The hard mask layer 495 is preferably formed using amorphous silicon, which can be deposited by a PCVD method or a sputtering method.

<Method for Manufacturing Semiconductor Device>

A method for manufacturing the semiconductor device according to one embodiment of the present invention is described with reference to FIGS. 2A-1 to 2A-3, 2B-1 to 2B-3, and 2C-1 to 2C-3; FIGS. 3A-1 to 3A-3, 3B-1 to 3B-3, and 3C-1 to 3C-3; FIGS. 4A-1 to 4A-3, 4B-1 to 4B-3, and 4C-1 to 4C-3; FIGS. 5A-1 to 5A-3, 5B-1 to 5B-3, and 5C-1 to 5C-3; and FIGS. 6A-1 to 6A-3, 6B-1 to 6B-3, and 6C-1 to 6C-3.

FIGS. 2A-1 to 2A-3, 2B-1 to 2B-3, and 2C-1 to 2C-3 illustrate the steps from formation of the gate electrode layer 401 to oxygen doping of the oxide semiconductor layer 403.

First, the substrate 400 is prepared, the base insulating layer 436 is formed over the substrate 400, and the gate electrode layer 401 is formed over the base insulating layer 436 (see FIGS. 2A-1 to 2A-3).

The gate electrode layer 401 is formed by depositing a material that can be used as a gate electrode using sputtering, for example, and then selectively etching part of the material. Note that the etching may be dry etching, wet etching, or both dry etching and wet etching. The substrate 400 and the gate electrode layer 401 may be subjected to heat treatment after the formation of the gate electrode layer 401.

Next, the insulating layer 432 is formed over the base insulating layer 436 and the gate electrode layer 401. The insulating layer 432 is preferably planarized so that the gate electrode layer 401 is exposed and the insulating layer 432 and the gate electrode layer 401 are planarized (see FIGS. 2B-1 to 2B-3). As the planarization treatment, chemical mechanical polishing (CMP) treatment or the like may be performed.

The insulating layer 432 and the gate electrode layer 401 are preferably planarized so that non-coverage of the oxide semiconductor layer 403, which is described later, due to a step caused by the gate electrode layer 401 can be prevented.

Next, the gate insulating layer 402 is formed over the gate electrode layer 401, and the oxide semiconductor layer 403 is formed over the gate insulating layer 402 (see FIGS. 2C-1 to 2C-3).

For example, for the gate insulating layer 402, a film of a material which can be used for the gate insulating layer 402 can be formed by a PCVD method.

Note that before the oxide semiconductor layer 403 is formed, heat treatment may be performed for dehydration or dehydrogenation of the gate insulating layer 402. For example, heat treatment may be performed at a temperature higher than or equal to 350° C. and lower than or equal to 450° C.

In addition, oxygen may be supplied to the gate insulating layer 402 which has been dehydrated or dehydrogenated. Oxygen may be contained in the gate insulating layer 402, or in the gate insulating layer 402 and in the vicinity of an interface of the gate insulating layer 402. By the supply of oxygen to the gate insulating layer 402 after dehydration or dehydrogenation, the release of oxygen can be suppressed and the concentration of oxygen in the gate insulating layer 402 can be increased. Oxygen can be supplied by oxygen doping treatment or the like.

Note that in the case of performing heat treatment for supplying oxygen from the gate insulating layer 402 to the oxide semiconductor, the heat treatment is preferably performed before the oxide semiconductor is processed into an island shape, in which case oxygen contained in the gate insulating layer 402 can be prevented from being released by the heat treatment.

For example, the heat treatment is performed at a temperature higher than or equal to 350° C. and lower than the strain point of the substrate, preferably higher than or equal to 350° C. and lower than or equal to 450° C. Heat treatment may be further performed in a later step. As a heat treatment apparatus for the heat treatment, for example, an electric furnace or an apparatus for heating an object by heat conduction or heat radiation from a heater such as a resistance heater can be used; for example, a rapid thermal annealing (RTA) apparatus such as a gas rapid thermal annealing (GRTA) apparatus or a lamp rapid thermal annealing (LRTA) apparatus can be used.

Further, after the heat treatment is performed and while the heating temperature is being maintained or being decreased, a high-purity oxygen gas, a high-purity $N_2O$ gas, or ultra-dry air (having a dew point of −40° C. or lower, preferably −60° C. or lower) may be introduced into the furnace where the heat treatment has been performed. It is preferable that the oxygen gas or the $N_2O$ gas do not contain water, hydrogen, and the like. The purity of the oxygen gas or the $N_2O$ gas which is introduced into the heat treatment apparatus is preferably 6N or higher, further preferably 7N or higher; that is, the impurity concentration in the oxygen gas or the $N_2O$ gas is preferably 1 ppm or lower, further preferably 0.1 ppm or lower. By the action of the oxygen gas or the $N_2O$ gas, oxygen is supplied to the oxide semiconductor, and defects due to oxygen vacancies in the oxide semiconductor can be reduced. Note that the high-purity oxygen gas, high-purity $N_2O$ gas, or ultra-dry air may be introduced during the heat treatment.

Further, oxygen doping 451 is performed on the oxide semiconductor (see FIGS. 2C-1 to 2C-3). This is for supplying oxygen to the oxide semiconductor to fill oxygen vacancies in the oxide semiconductor. Filling the oxygen vacancies makes the semiconductor device less likely to exhibit abnormal initial electric characteristics (e.g., threshold voltage) and improves its reliability in electric characteristics (e.g., threshold voltage).

The oxygen doping 451 can be performed by an ion implantation method, an ion doping method, a plasma immersion ion implantation method, plasma treatment, or the like. By use of such methods, the oxide semiconductor can be doped with oxygen (an oxygen radical, an oxygen atom, an oxygen molecule, ozone, an oxygen ion (an oxygen molecular ion), and/or an oxygen cluster ion).

FIGS. 3A-1 to 3A-3, 3B-1 to 3B-3, and 3C-1 to 3C-3 illustrate the steps from processing of the oxide semiconductor layer 403 into an island shape to formation of a resist 453 for forming the first low-resistance material layer 405a and the second low-resistance material layer 405b.

The oxide semiconductor layer 403 is processed into an island-shaped oxide semiconductor layer 403 by a photolithography step (see FIGS. 3A-1 to 3A-3).

The etching of the oxide semiconductor layer 403 may be dry etching, wet etching, or both dry etching and wet etching.

Note that the width of the oxide semiconductor layer in the channel length direction is preferably larger than the width of the gate electrode layer in the channel length direction. In that case, the oxide semiconductor layer overlaps with the gate electrode layer in a large area, which enables the oxide semiconductor layer to be supplied with oxygen more easily from an insulating layer below the oxide semiconductor layer. As a result, the initial electric characteristics (e.g., threshold voltage) and reliability in electric characteristics (e.g., threshold voltage) of the transistor can be improved.

Next, a conductive layer 454 is formed in contact with the oxide semiconductor layer 403. The conductive layer 454 may be formed by a sputtering method or the like (see FIGS. 3B-1 to 3B-3).

Then, a low-resistance material layer 405 is formed in contact with the conductive layer 454. The low-resistance material layer 405 may be formed by a sputtering method or the like.

Next, the resist 453 is formed by a photolithography step (see FIGS. 3C-1 to 3C-3).

FIGS. 4A-1 to 4A-3, 4B-1 to 4B-3, and 4C-1 to 4C-3 illustrate the steps from processing of the low-resistance material layer 405 to planarization of the first protective layer 406.

The low-resistance material layer 405 is selectively etched using the resist 453 as a mask; thus, the low-resistance material layer 405a and the low-resistance material layer 405b are formed (see FIGS. 4A-1 to 4A-3). The conditions for etching the low-resistance material layer 405 are set such that the conductive layer 454 is not easily etched. This is because an opening is formed in the conductive layer 454 in a later step with the use of the hard mask layer 495 as a mask.

Next, a region of the conductive layer 454 which is not in contact with the oxide semiconductor layer 403 is etched (see FIGS. 4B-1 to 4B-3).

Then, the first protective layer 406 is formed and planarized by CMP (see FIGS. 4C-1 to 4C-3). The surface of the first protective layer 406 is planarized so that, even when a resist as thin as about 30 nm is applied thereon, no region is formed which cannot be covered with the resist owing to a step on the surface where the resist is to be applied.

FIGS. 5A-1 to 5A-3, 5B-1 to 5B-3, and 5C-1 to 5C-3 illustrate the steps for forming the hard mask layer 495.

The hard mask layer 495 is formed over the planarized first protective layer 406 (see FIGS. 5A-1 to 5A-3). The hard mask layer 495 is preferably a film that is not easily etched under conditions for etching the first protective layer 406. This is because the hard mask layer 495 is used as a mask in the etching of the first protective layer 406.

Next, a resist is formed over the hard mask layer 495 and subjected to exposure to an electron beam; thus, a resist 455 is formed (see FIGS. 5B-1 to 5B-3).

Here, the thickness of the resist is preferably set such that the ratio of the thickness of the resist to the width of the manufactured pattern becomes 1:1 to 1:2. For example, in the case where the width of the pattern is 30 nm, the thickness of the resist is set within 30 nm to 60 nm.

The surface of the hard mask layer 495 is flat. Therefore, even a resist as thin as about 30 nm can be uniformly applied on the surface where the resist is to be applied.

Next, the hard mask layer 495 is etched (see FIGS. 5C-1 to 5C-3). The etching method is preferably dry etching. The resist may be removed after the hard mask layer 495 is etched. In this embodiment, the hard mask layer 495 includes an opening which overlaps with a channel formation region of the oxide semiconductor layer 403.

FIGS. 6A-1 to 6A-3, 6B-1 to 6B-3, and 6C-1 to 6C-3 illustrate the steps from formation of an opening in the first protective layer 406 to formation of an opening in the conductive layer 454.

The first protective layer 406 is etched (see FIGS. 6A-1 to 6A-3). The conditions for etching the first protective layer 406 are preferably set such that the ratio of the etching rate of the first protective layer 406 to that of the hard mask layer 495 is high. This is for forming an opening with a width (width in the channel length direction) of about 30 nm in the first protective layer 406 with the use of the hard mask layer 495 as a mask.

Next, the conductive layer 454 is etched, so that the first conductive layer 454a and the second conductive layer 454b are formed. A channel is to be formed between the first conductive layer 454a and the second conductive layer 454b (see FIGS. 6B-1 to 6B-3). The conditions for etching the conductive layer 454 are preferably set such that the ratio of the etching rate of the conductive layer 454 to that of the oxide semiconductor layer 403 is high. This is for preventing the surface of the oxide semiconductor layer 403 from being damaged by the etching.

In the case of forming an opening with a width (width in the channel length direction) of about 30 nm, the resist 455 is as thin as 30 nm to 60 nm. Therefore, the resist 455 is removed during the etching of the first protective layer 406 and the conductive layer 454. However, since the hard mask layer 495 serves as a mask, an opening with a width of about 30 nm can be formed in the conductive layer 454 even though the resist 455 is removed.

Next, the opening formed in the conductive layer 454 in the above step is covered with the second protective layer 407 (see FIGS. 6C-1 to 6C-3). A film which can prevent entry of moisture, hydrogen, or the like into the oxide semiconductor layer 403 is preferably used as the second protective layer 407. For example, a silicon oxide film, a silicon oxynitride film, a silicon nitride film, an aluminum oxide film, or the like can be used.

The second protective layer 407 preferably contains excess oxygen. The as-deposited second protective layer 407 may contain excess oxygen, or the second protective layer 407 may be subjected to oxygen doping. For example, the doping with oxygen (an oxygen radical, an oxygen atom, an oxygen molecule, ozone, an oxygen ion (an oxygen molecular ion), and/or an oxygen cluster ion) can be performed by an ion implantation method, an ion doping method, a plasma immersion ion implantation method, plasma treatment, or the like. For the ion implantation method, a gas cluster ion beam may be used.

After the second protective layer 407 is formed, heat treatment may be performed. For example, heat treatment is performed at 250° C. for one hour in a nitrogen atmosphere.

Through the above steps, the transistor 440 can be manufactured. The channel length L of the transistor 440 manufactured at that time is about 30 nm. Therefore, the transistor 440 can have high on-state current.

The above is the method for manufacturing the semiconductor device according to one embodiment of the present invention.

Through the above method for manufacturing a semiconductor device, a bottom-gate transistor in which the oxide semiconductor layer 403 is used as an active layer and whose channel length is about 30 nm can be manufactured.

Embodiment 2

Figure 7A:
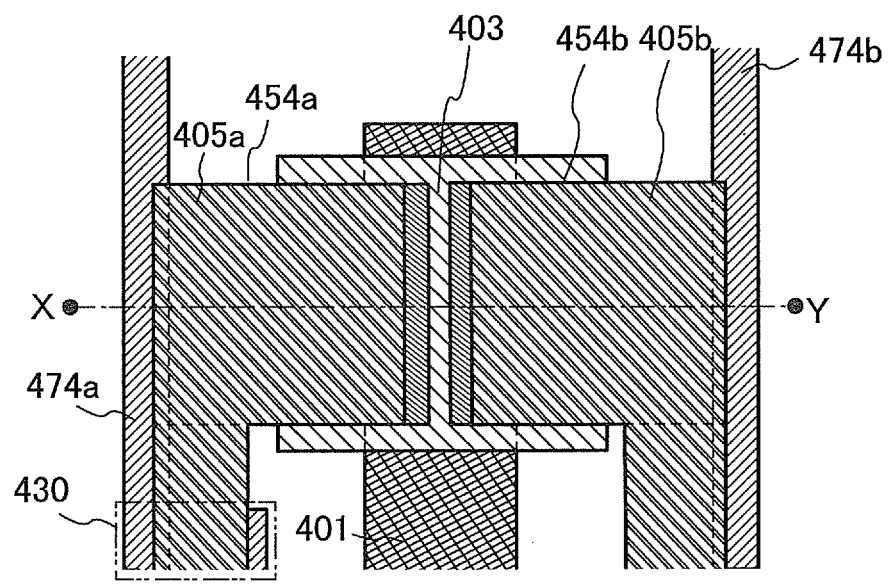
FIGS. 7A and 7B are a plan view and a cross-sectional view illustrating one embodiment of the present invention.
Figure 7B:
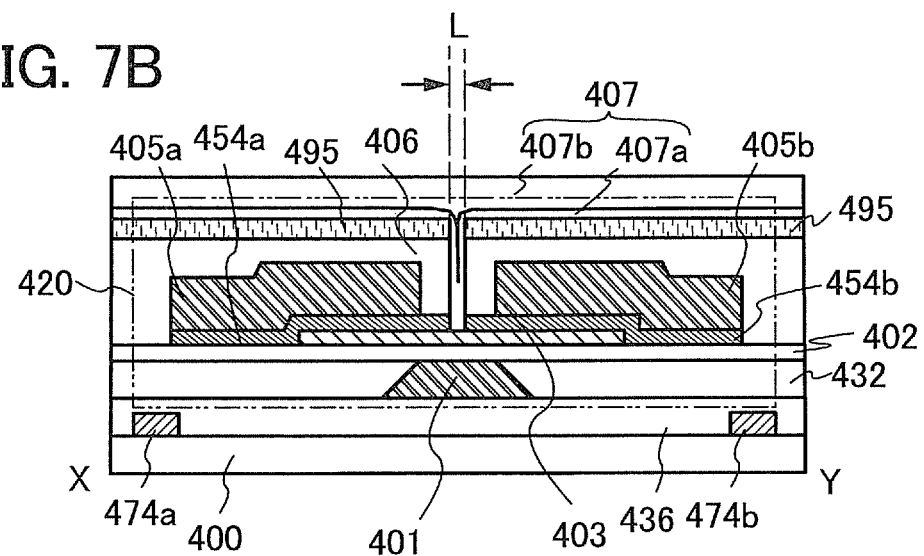

In this embodiment, one embodiment of a semiconductor device will be described with reference to FIGS. 7A and 7B. FIG. 7A is a plan view of a transistor 420, and FIG. 7B is a cross-sectional view taken along line X-Y in FIG. 7A. Note that in FIG. 7A, some components of the transistor 420 (e.g., the gate insulating layer 402) are not illustrated for simplicity. A channel length L of the transistor 420 is greater than or equal to 20 nm and less than or equal to 100 nm, preferably greater than or equal to 20 nm and less than or equal to 50 nm, more preferably greater than or equal to 20 nm and less than or equal to 30 nm. In this embodiment, the channel length L is about 30 nm.

The transistor 420 illustrated in FIGS. 7A and 7B includes, over the base insulating layer 436 formed over a surface of the substrate 400, the gate electrode layer 401 provided so as to be buried in the insulating layer 432, the gate insulating layer 402 over the gate electrode layer 401, the oxide semiconductor layer 403 over the gate insulating layer 402, the first conductive layer 454a and the second conductive layer 454b over the oxide semiconductor layer 403, the first low-resistance material layer 405a on and in contact with the first conductive layer 454a, the second low-resistance material layer 405b on and in contact with the second conductive layer 454b, the first protective layer 406 in contact with the first low-resistance material layer 405a, the second low-resistance material layer 405b, the first conductive layer 454a, and the second conductive layer 454b, the hard mask layer 495 in contact with the first protective layer 406, and the second protective layer 407 over the hard mask layer 495.

Embodiment 1 can be referred to for the structure and manufacturing method of the semiconductor device described in this embodiment.

(Circuit which can be Provided Over the Substrate 400)

Figure 8:
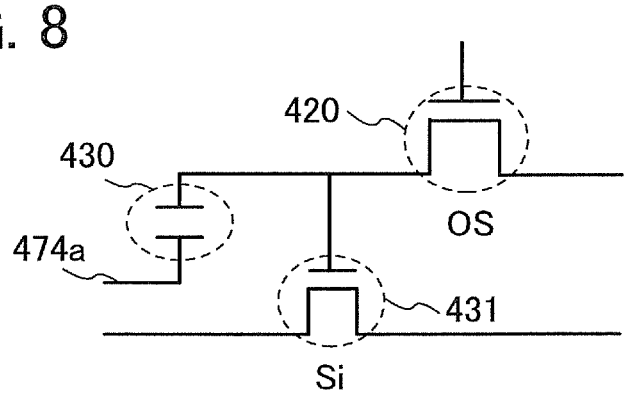
FIG. 8 is a circuit diagram illustrating one embodiment of the present invention.

The substrate 400 is provided with a semiconductor element, which is not illustrated here for simplicity. Wiring layers 474a and 474b and the base insulating layer 436 covering the wiring layers 474a and 474b are provided over the substrate 400, part of which is a component of a memory illustrated in FIG. 8. FIG. 8 illustrates an example of an equivalent circuit, showing a connection between the transistor 420 and a transistor 431 formed using the substrate 400.

A capacitor 430 is a capacitor in which the source electrode layer or the drain electrode layer, which includes stacked layers, and the wiring layer 474a serve as a pair of electrodes and the base insulating layer 436 and the gate insulating layer 402, which includes stacked layers, serve as a dielectric.

In the memory configuration illustrated in FIG. 8, writing to the memory is performed by injection of charge into the capacitor 430. The transistor described in this embodiment has a channel length about 30 nm, and thus has high on-state current. Therefore, writing to the memory can be performed at high speed.

The memory configuration illustrated in FIG. 8 has the advantages of being capable of holding stored data even when not powered and having an unlimited number of write cycles. This is because, since the transistor described in this embodiment has low off-state current, the charge stored in the capacitor 430 is not easily released.

Embodiment 3

Figure 9A:
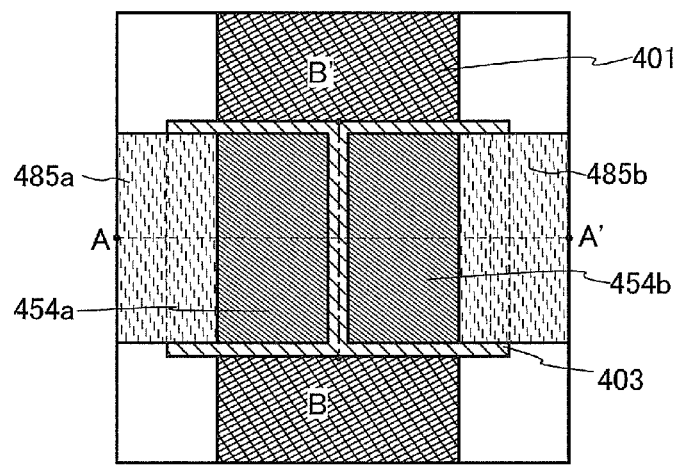
FIGS. 9A to 9C are a plan view and cross-sectional views illustrating one embodiment of the present invention.
Figure 9B:
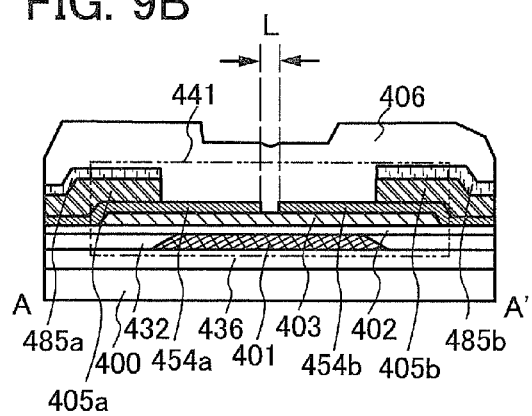
Figure 9C:
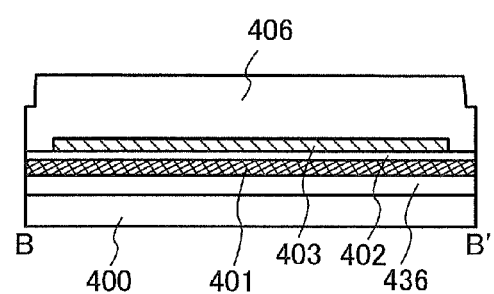

In this embodiment, one embodiment of a semiconductor device which can be manufactured according to the present invention will be described with reference to FIGS. 9A to 9C. FIG. 9A is a plan view of a transistor 441, FIG. 9B is a cross-sectional view taken along line A-A' in FIG. 9A, and FIG. 9C is a cross-sectional view taken along line B-B' in FIG. 9A. Note that in FIG. 9A, some components of the transistor 441 (e.g., the gate insulating layer 402) are not illustrated for simplicity. A channel length L of the transistor 441 is greater than or equal to 20 nm and less than or equal to 100 nm, preferably greater than or equal to 20 nm and less than or equal to 50 nm, more preferably greater than or equal to 20 nm and less than or equal to 30 nm. In this embodiment, the channel length L is about 30 nm.

The transistor 441 in FIGS. 9A to 9C is a bottom-gate transistor. The transistor 441 illustrated in FIGS. 9A to 9C includes the substrate 400, the base insulating layer 436, the insulating layer 432, the gate electrode layer 401, the gate insulating layer 402, the oxide semiconductor layer 403, the first conductive layer 454a, the second conductive layer 454b, the first low-resistance material layer 405a, the second low-resistance material layer 405b, a first wiring protective layer 485a, a second wiring protective layer 485b, and the first protective layer 406.

The base insulating layer 436 is provided in contact with a surface of the substrate 400. The insulating layer 432 is in contact with the base insulating layer 436. The gate electrode layer 401 is buried in the insulating layer 432. The gate insulating layer 402 is provided on and in contact with the gate electrode layer 401. The oxide semiconductor layer 403 is provided on and in contact with the gate insulating layer 402. The first conductive layer 454a and the second conductive layer 454b are provided on and in contact with the oxide semiconductor layer 403. The first low-resistance material layer 405a is provided on and in contact with the first conductive layer 454a. The second low-resistance material layer 405b is provided on and in contact with the second conductive layer 454b. The first wiring protective layer 485a is provided on and in contact with the first low-resistance material layer 405a. The second wiring protective layer 485b is provided on and in contact with the second low-resistance material layer 405b. The first protective layer 406 is provided in contact with the first conductive layer 454a, the second conductive layer 454b, the first wiring protective layer 485a, the second wiring protective layer 485b, and the oxide semiconductor layer 403.

First, components will be described below.

<Components of the Semiconductor Device>

Embodiment 1 can be referred to for details of the substrate, the base insulating layer, the gate electrode layer, the gate insulating layer, the source electrode layer, the drain electrode layer, the oxide semiconductor layer, and the protective layer.

(Wiring Protective Layer)

A wiring protective layer 485 is preferably a film that is not easily etched under conditions for etching the conductive layer 454. The first low-resistance material layer 405a and the second low-resistance material layer 405b are used as lead wirings for connecting transistors; therefore, the low-resistance material layer 405 has a thickness greater than or equal to 100 nm. This means that the difference in height between the surface of the low-resistance material layer 405 and the surface of the conductive layer 454 is at least greater than or equal to 100 nm. Without the wiring protective layer 485, the end of the low-resistance material layer 405 is not covered with a resist, or covered with a thin resist even if covered; thus, the low-resistance material layer 405 is damaged by the etching for processing the conductive layer 454. In order to prevent that damage, the wiring protective layer 485 which is not easily etched under conditions for etching the conductive layer 454 is provided over the low-resistance material layer 405 to prevent the low-resistance material layer 405 from being etched. The wiring protective layer 485 is preferably formed using silicon oxide, silicon nitride, silicon oxynitride, or aluminum oxide. Silicon oxide, silicon nitride, and silicon oxynitride can be deposited by a PCVD method or a sputtering method. Aluminum oxide can be deposited by a sputtering method.

<Method for Manufacturing Semiconductor Device>

A method for manufacturing the semiconductor device according to one embodiment of the present invention is described with reference to FIGS. 2A-1 to 2A-3, 2B-1 to 2B-3, and 2C-1 to 2C-3; FIGS. 10A-1 to 10A-3, 10B-1 to 10B-3, and 10C-1 to 10C-3; FIGS. 11A-1 to 11A-3, 11B-1 to 11B-3, and 11C-1 to 11C-3; and FIGS. 12A-1 to 12A-3 and 12B-1 to 12B-3.

FIGS. 2A-1 to 2A-3, 2B-1 to 2B-3, and 2C-1 to 2C-3 illustrate the steps from formation of the gate electrode layer 401 to oxygen doping of the oxide semiconductor layer 403. Embodiment 1 can be referred to for these steps.

FIGS. 10A-1 to 10A-3, 10B-1 to 10B-3, and 10C-1 to 10C-3 illustrate the steps from processing of the oxide semiconductor layer 403 into an island shape to formation of the resist 453 for forming the low-resistance material layer 405 and the wiring protective layer 485.

The oxide semiconductor layer 403 is processed into an island-shaped oxide semiconductor layer 403 by a photolithography step (see FIGS. 10A-1 to 10A-3). Refer to Embodiment 1 for details.

Next, the conductive layer 454 is formed in contact with the oxide semiconductor layer 403. The conductive layer 454 may be formed by a sputtering method or the like. Then, the low-resistance material layer 405 is formed in contact with the conductive layer 454. The low-resistance material layer 405 may be formed by a sputtering method or the like. Then, the wiring protective layer 485 is formed in contact with the low-resistance material layer 405. The wiring protective layer 485 may be formed by a sputtering method or the like (see FIGS. 10B-1 to 10B-3).

Next, the resist 453 is formed by a photolithography step (see FIGS. 10C-1 to 10C-3).

FIGS. 11A-1 to 11A-3, 11B-1 to 11B-3, and 11C-1 to 11C-3 illustrate the steps from processing of the wiring protective layer 485 and the low-resistance material layer 405 to formation of the resist 455 for forming the first conductive layer 454a and the second conductive layer 454b.

The wiring protective layer 485 and the low-resistance material layer 405 are selectively etched using the resist 453 as a mask; thus, the first wiring protective layer 485a, the second wiring protective layer 485b, the first low-resistance material layer 405a, and the second low-resistance material layer 405b are formed (see FIGS. 11A-1 to 11A-3). The wiring protective layer 485 and the low-resistance material layer 405 may be processed using the same resist pattern, or may be processed by forming their respective resist patterns. The wiring protective layer 485 and the low-resistance material layer 405 are preferably etched under conditions such that the conductive layer 454 is not easily etched.

Next, a region of the conductive layer 454 which is not in contact with the oxide semiconductor layer 403 is etched (see FIGS. 11B-1 to 11B-3).

Next, a resist is formed over the conductive layer 454, the first wiring protective layer 485a, and the second wiring protective layer 485b. Here, the thickness of the resist is preferably set such that the ratio of the thickness of the resist to the width of the manufactured pattern becomes 1:1 to 1:2. For example, in the case where the width of the pattern is 30 nm, the thickness of the resist is set within 30 nm to 60 nm. The resist is subjected to exposure to an electron beam, so that the resist 455 is formed (see FIGS. 11C-1 to 11C-3).

The first low-resistance material layer 405a and the second low-resistance material layer 405b can be used as lead wirings for connecting transistors. High wiring resistance of a lead wiring causes a problem of wiring delay in an integrated circuit; thus, the wiring resistance needs to be lowered. Therefore, the low-resistance material layer 405 needs a thickness greater than or equal to 100 nm in general. This means that the difference in height between the surface of the low-resistance material layer 405 and the surface of the conductive layer 454 is at least greater than or equal to 100 nm. Without the wiring protective layer 485 over the low-resistance material layer 405, the ends of the first low-resistance material layer 405a and the second low-resistance material layer 405b are not covered with a resist, or covered with a thin resist even if covered; thus, the first low-resistance material layer 405a and the second low-resistance material layer 405b are etched at the time of processing the conductive layer 454. However, in the manufacturing method according to one embodiment of the present invention, the wiring protective layer 485 which is not easily etched under conditions for etching the conductive layer 454 is provided on and in contact with the low-resistance material layer 405, so that the first low-resistance material layer 405a and the second low-resistance material layer 405b are not reduced in thickness and the surfaces thereof are not damaged in the processing of the conductive layer 454; thus, an increase in wiring resistance is prevented. Therefore, wiring delay is less likely to occur in an integrated circuit which includes a semiconductor device manufactured by the manufacturing method.

FIGS. 12A-1 to 12A-3 and 12B-1 to 12B-3 illustrate the steps from processing of the conductive layer 454 to formation of the first protective layer 406.

The conductive layer 454 is etched using the resist 455 as a mask, so that the first conductive layer 454a and the second conductive layer 454b are formed. A channel is to be formed between the first conductive layer 454a and the second conductive layer 454b (see FIGS. 12A-1 to 12A-3).

The conditions for etching the conductive layer 454 are preferably set such that the ratio of the etching rate of the conductive layer 454 to that of the oxide semiconductor layer 403 is high. This is for preventing the surface of the oxide semiconductor layer 403 from being damaged by the etching.

In the case of forming an opening with a width of about 30 nm, the resist 455 is as thin as 30 nm to 60 nm; thus, a region which cannot be covered with a resist may be formed at the ends of the first wiring protective layer 485a and the second wiring protective layer 485b, for example. Accordingly, there may be a region where the resist 455 is removed during the etching of the conductive layer 454 or a region which is etched without being covered with a resist. However, in a region which is less likely to be covered with a resist, for example, at the ends of the first wiring protective layer 485a and the second wiring protective layer 485b, the first low-resistance material layer 405a and the second low-resistance material layer 405b are not etched even when the resist 455 is removed because the first wiring protective layer 485a and the second wiring protective layer 485b protect the low-resistance material layers.

Next, the opening formed in the conductive layer 454 in the above step is covered with the first protective layer 406 (see FIGS. 12B-1 to 12B-3). A film which can prevent entry of moisture, hydrogen, or the like into the oxide semiconductor layer 403 is preferably used as the first protective layer 406. For example, a silicon oxide film, a silicon oxynitride film, a silicon nitride film, an aluminum oxide film, or the like can be used.

The first protective layer 406 preferably contains excess oxygen. For example, the first protective layer 406 is preferably formed using a silicon oxide film, a silicon oxynitride film, or an aluminum oxide film containing much oxygen. Alternatively, the first protective layer 406 may include two layers. The first layer provided in contact with the oxide semiconductor can be formed using an oxide semiconductor film containing gallium (Ga), a silicon oxide film, a silicon oxynitride film, or an aluminum oxide film which is deposited with conditions set as appropriate so as to contain much oxygen. The second layer can be formed using a silicon oxide film, a silicon oxynitride film, or an aluminum oxide film containing much oxygen. In order to make the first protective layer 406 contain much excess oxygen, oxygen may be added as appropriate to the first protective layer 406 by an ion implantation method, an ion doping method, or plasma treatment.

After the first protective layer 406 is formed, heat treatment may be performed. For example, heat treatment is performed at 250° C. for one hour in a nitrogen atmosphere.

Through the above steps, the transistor 441 can be manufactured. The channel length L of the transistor 441 manufactured at that time is about 30 nm. Therefore, the transistor 441 can have high on-state current.

The above is the method for manufacturing the semiconductor device according to one embodiment of the present invention.

The structures, methods, and the like described in this embodiment can be combined as appropriate with any of the structures, methods, and the like described in the other embodiments.

Embodiment 4

Figure 13A:
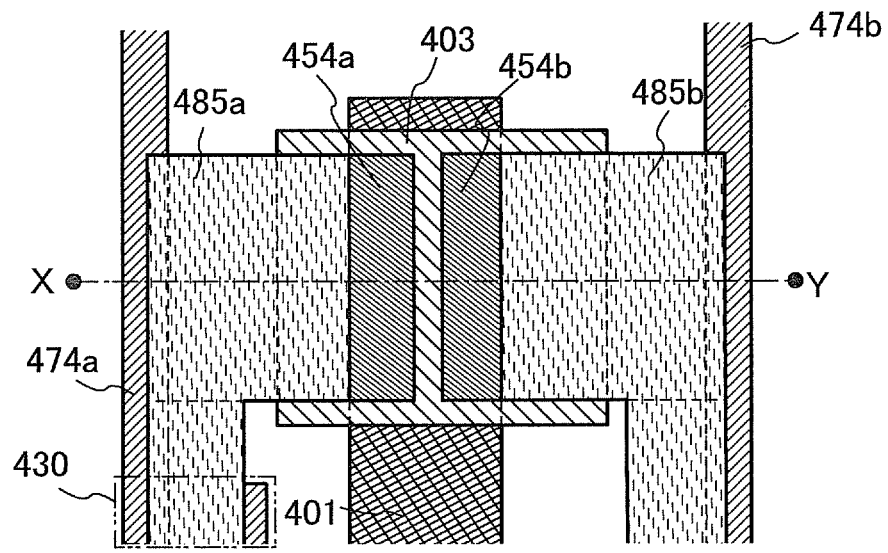
FIGS. 13A and 13B are a plan view and a cross-sectional view illustrating one embodiment of the present invention.
Figure 13B:
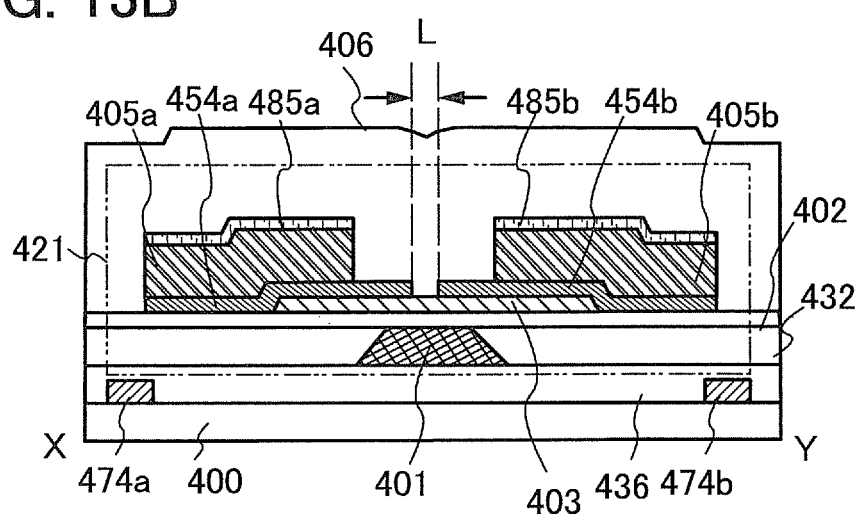

In this embodiment, one embodiment of a semiconductor device will be described with reference to FIGS. 13A and 13B. FIG. 13A is a plan view of a transistor 421, and FIG. 13B is a cross-sectional view taken along line X-Y in FIG. 13A. Note that in FIG. 13A, some components of the transistor 421 (e.g., the gate insulating layer 402) are not illustrated for simplicity. A channel length L of the transistor 421 is greater than or equal to 20 nm and less than or equal to 100 nm, preferably greater than or equal to 20 nm and less than or equal to 50 nm, more preferably greater than or equal to 20 nm and less than or equal to 30 nm. In this embodiment, the channel length L is about 30 nm.

The transistor 421 illustrated in FIGS. 13A and 13B includes the substrate 400, the base insulating layer 436, the insulating layer 432, the gate electrode layer 401, the gate insulating layer 402, the oxide semiconductor layer 403, the first conductive layer 454a, the second conductive layer 454b, the first low-resistance material layer 405a, the second low-resistance material layer 405b, the first wiring protective layer 485a, the second wiring protective layer 485b, and the first protective layer 406.

The base insulating layer 436 is provided in contact with a surface of the substrate 400. The insulating layer 432 is in contact with the base insulating layer 436. The gate electrode layer 401 is buried in the insulating layer 432. The gate insulating layer 402 is provided on and in contact with the gate electrode layer 401. The oxide semiconductor layer 403 is provided on and in contact with the gate insulating layer 402. The first conductive layer 454a and the second conductive layer 454b are provided on and in contact with the oxide semiconductor layer 403. The first low-resistance material layer 405a is provided on and in contact with the first conductive layer 454a. The second low-resistance material layer 405b is provided on and in contact with the second conductive layer 454b. The first wiring protective layer 485a is provided on and in contact with the first low-resistance material layer 405a. The second wiring protective layer 485b is provided on and in contact with the second low-resistance material layer 405b. The first protective layer 406 is provided in contact with the first conductive layer 454a, the second conductive layer 454b, the first wiring protective layer 485a, the second wiring protective layer 485b, and the oxide semiconductor layer 403.

Embodiment 3 can be referred to for the structure and manufacturing method of the semiconductor device described in this embodiment.

Embodiment 5

In this embodiment, a c-axis aligned crystalline oxide semiconductor (CAAC-OS) film, which can be used as the oxide semiconductor layer 403 exemplified in Embodiments 1 and 3, will be described.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, the c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification and the like, a simple term "perpendicular" includes a range from 85° to 95°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases.

Since the c-axes of the crystal parts included in the CAAC-OS film are aligned in the direction perpendicular to the surface where the CAAC-OS film is formed or a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction perpendicular to the surface where the CAAC-OS film is formed or the surface of the CAAC-OS film. The crystal part is formed by deposition or by performing treatment for crystallization such as heat treatment after deposition.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, further preferably less than or equal to 0.1 nm. Since the transistor 440 is a bottom-gate transistor, it is possible to improve the planarity of the surface where the oxide semiconductor layer 403 is to be formed by performing planarization treatment such as CMP treatment after the formation of the gate electrode layer 401 and the base insulating layer 436 to obtain the above flat surface.

When the CAAC-OS film is used as the oxide semiconductor layer 403 in a transistor, change in electric characteristics (e.g., threshold voltage) of the transistor due to irradiation with visible light or ultraviolet light can be reduced. Thus, the transistor has high reliability.

Embodiment 6

In this embodiment, an example of a semiconductor device (memory device) which includes the transistor described in this specification, which can hold stored data even when not powered, and which has an unlimited number of write cycles will be described with reference to drawings.

Figure 14A:
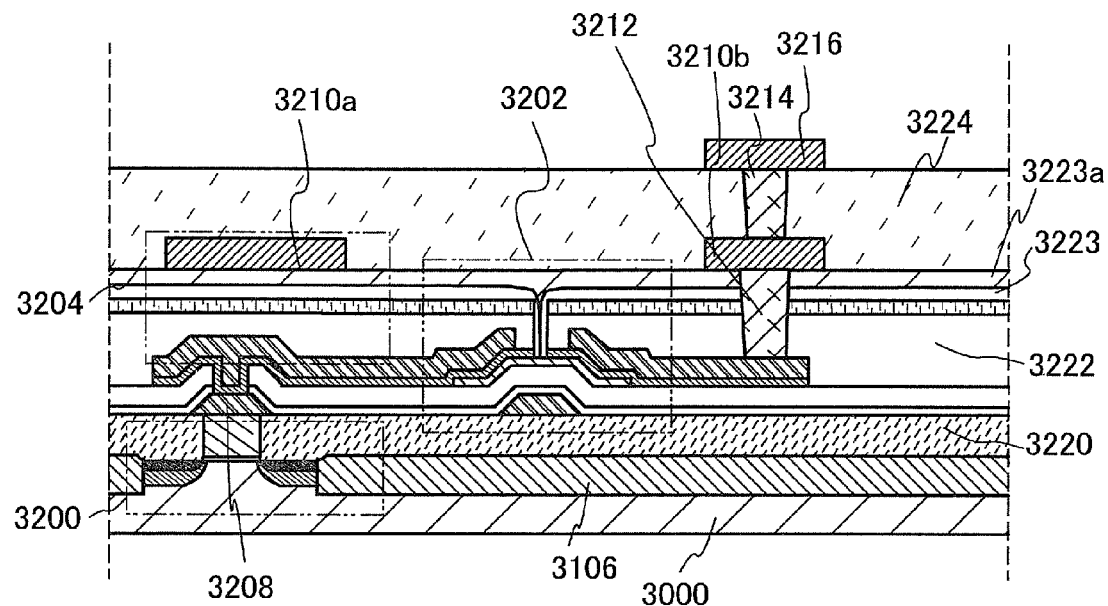
FIGS. 14A and 14B illustrate an example of a memory device.
Figure 14B:
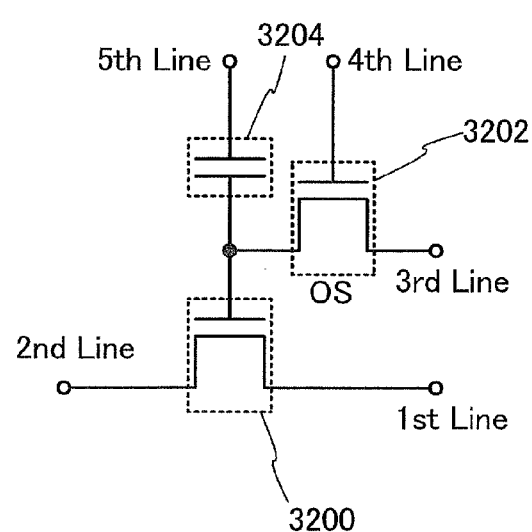

FIGS. 14A and 14B illustrate an example of a structure of the semiconductor device. FIG. 14A is a cross-sectional view of the semiconductor device, and FIG. 14B is a circuit diagram of the semiconductor device.

The semiconductor device illustrated in FIGS. 14A and 14B includes a transistor 3200 including a first semiconductor material in a lower portion, and a transistor 3202 including a second semiconductor material in an upper portion. The structure of the transistor 440 described in Embodiment 1 is applied to the transistor 3202.

Here, the first semiconductor material and the second semiconductor material are preferably materials having different band gaps. For example, the first semiconductor material can be a semiconductor material (such as silicon) other than a wide band gap semiconductor, and the second semiconductor material can be a wide band gap semiconductor. A transistor including a material other than a wide band gap semiconductor can operate at high speed easily. On the other hand, a transistor including a wide band gap semiconductor enables charge to be held for a long time owing to its characteristics.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to those described here except for the use of the transistor described in any of Embodiments 1 to 4, which is formed using a wide band gap semiconductor for holding data.

The transistor 3200 in FIG. 14A includes a channel formation region provided in a substrate 3000 including a semiconductor material (such as silicon), impurity regions provided such that the channel formation region is sandwiched therebetween, intermetallic compound regions provided in contact with the impurity regions, a gate insulating layer provided over the channel formation region, and a gate electrode layer provided over the gate insulating layer. Note that a transistor whose source electrode layer and drain electrode layer are not illustrated in a drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3106 is formed on the substrate 3000 so as to surround the transistor 3200, and an insulating layer 3220 is formed so as to cover the transistor 3200.

The transistor 3200 formed using a single crystal semiconductor substrate can operate at high speed. Thus, when the transistor is used as a reading transistor, data can be read at a high speed. As treatment prior to formation of the transistor 3202 and a capacitor 3204, CMP treatment is performed on the insulating layer 3220 covering the transistor 3200, whereby the insulating layer 3220 is planarized and, at the same time, an upper surface of the gate electrode layer of the transistor 3200 is exposed.

The transistor 3202 shown in FIG. 14A is a bottom-gate transistor including a wide band gap semiconductor in the channel formation region. Here, an oxide semiconductor layer included in the transistor 3202 is preferably highly purified. By using a highly purified oxide semiconductor layer, the transistor 3202 which has extremely favorable off-state characteristics can be obtained.

FIG. 14B shows an example of a semiconductor memory device which includes the transistor 3202. When a transistor with low off-state current is used as the transistor 3202, stored data can be held for a long time in the semiconductor memory device. In other words, refresh operation becomes unnecessary or the frequency of the refresh operation can be extremely lowered, which leads to a sufficient reduction in power consumption.

One of source and drain electrode layers of the transistor 3202 is electrically connected to an electrode 3208 through an opening provided in a gate insulating layer and is electrically connected to the gate electrode layer of the transistor 3200 via the electrode 3208. The electrode 3208 can be formed through a process similar to that for a gate electrode layer of the transistor 3202.

Insulating layers 3222, 3223, and 3223a are provided over the transistor 3202. In addition, a conductive layer 3210a is provided in a region overlapping with the one of the source and drain electrode layers of the transistor 3202 with the insulating layers 3222, 3223, and 3223a provided therebetween, and the one of the source and drain electrode layers of the transistor 3202, the insulating layer 3222, and the conductive layer 3210a form the capacitor 3204. That is, the one of the source and drain electrode layers of the transistor 3202 functions as one electrode of the capacitor 3204, and the conductive layer 3210a functions as the other electrode of the capacitor 3204. Note that in the case where no capacitor is needed, a structure in which the capacitor 3204 is not provided is also possible. Alternatively, the capacitor 3204 may be separately provided above the transistor 3202.

An insulating layer 3224 is provided over the capacitor 3204. In addition, a wiring 3216 for connecting the transistor 3202 to another transistor is provided over the insulating layer 3224. The wiring 3216 is electrically connected to the other of the source and drain electrode layers of the transistor 3202 through an electrode 3214 provided in an opening formed in the insulating layer 3224, a conductive layer 3210b formed using the same layer as the conductive layer 3210a, and an electrode 3212 provided in an opening formed in the insulating layer 3222.

In FIGS. 14A and 14B, the transistors 3200 and 3202 are provided so as to at least partly overlap each other, and the source region or the drain region of the transistor 3200 is preferably provided to partly overlap with the oxide semiconductor layer included in the transistor 3202. In addition, the transistor 3202 and the capacitor 3204 are provided so as to overlap with at least part of the transistor 3200. For example, the conductive layer 3210a of the capacitor 3204 is provided so as to at least partly overlap with the gate electrode layer of the transistor 3200. When such a planar layout is employed, the area occupied by the semiconductor device can be reduced; thus, the degree of integration can be increased.

Next, an example of a circuit configuration corresponding to FIG. 14A is illustrated in FIG. 14B.

In FIG. 14B, a first wiring (1st Line) is electrically connected to a source electrode layer of the transistor 3200. A second wiring (2nd Line) is electrically connected to a drain electrode layer of the transistor 3200. A third wiring (3rd Line) is electrically connected to one of the source and drain electrode layers of the transistor 3202, and a fourth wiring (4th Line) is electrically connected to the gate electrode layer of the transistor 3202. The gate electrode layer of the transistor 3200 and the other of the source and drain electrode layers of the transistor 3202 are electrically connected to one electrode of the capacitor 3204. A fifth wiring (5th Line) is electrically connected to the other electrode of the capacitor 3204.

The semiconductor device in FIG. 14B utilizes a characteristic in which the potential of the gate electrode layer of the transistor 3200 can be held, and thus enables data writing, holding, and reading as follows.

Writing and holding of data will be described. First, the potential of the fourth wiring is set to a potential at which the transistor 3202 is turned on, so that the transistor 3202 is turned on. Accordingly, the potential of the third wiring is supplied to the gate electrode layer of the transistor 3200 and to the capacitor 3204. That is, predetermined charge is supplied to the gate electrode layer of the transistor 3200 (writing). Here, one of two kinds of charges providing different potential levels (hereinafter referred to as a low-level charge and a high-level charge) is supplied. After that, the potential of the fourth wiring is set to a potential at which the transistor 3202 is turned off, so that the transistor 3202 is turned off. Thus, the charge supplied to the gate electrode layer of the transistor 3200 is held (holding).

Since the off-state current of the transistor 3202 is significantly small, the charge of the gate electrode layer of the transistor 3200 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode layer of the transistor 3200. This is because in general, when the transistor 3200 is an n-channel transistor, an apparent threshold voltage $V_{th\_H}$ in the case where the high-level charge is given to the gate electrode layer of the transistor 3200 is lower than an apparent threshold voltage $V_{th\_L}$ in the case where the low-level charge is given to the gate electrode layer of the transistor 3200. Here, an apparent threshold voltage refers to the potential of the fifth wiring which is needed to turn on the transistor 3200. Thus, the potential of the fifth wiring is set to a potential $V_0$ which is between $V_{th\_H}$ and $V_{th\_L}$, whereby charge supplied to the gate electrode layer of the transistor 3200 can be determined. For example, in the case where the high-level charge is supplied in writing, when the potential of the fifth wiring is $V_0$ ($>V_{th\_H}$), the transistor 3200 is turned on. In the case where the low-level charge is supplied in writing, even when the potential of the fifth wiring is $V_0$ ($<V_{th\_L}$), the transistor 3200 remains off. Therefore, the data held can be read by measuring the potential of the second wiring.

Note that in the case where memory cells are arrayed, it is necessary that data of only a desired memory cell can be read. In that case, the fifth wirings of memory cells from which data is not read may be supplied with a potential at which the transistor 3200 is turned off regardless of the state of the gate electrode layer, that is, a potential lower than $V_{th\_H}$. Alternatively, the fifth wirings may be supplied with a potential at which the transistor 3200 is turned on regardless of the state of the gate electrode layer, that is, a potential higher than $V_{th\_L}$.

When including a transistor having a channel formation region formed using a wide band gap semiconductor and having extremely low off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data are written by turning on or off the transistors, high-speed operation can be easily achieved.

As described above, a miniaturized and highly integrated semiconductor device having favorable electric characteristics and a method for manufacturing the semiconductor device can be provided.

The structures, methods, and the like described in this embodiment can be combined as appropriate with any of the structures, methods, and the like described in the other embodiments.

Embodiment 7

In this embodiment, one embodiment of a structure of a memory device which is different from that in Embodiment 6 will be described.

Figure 15:
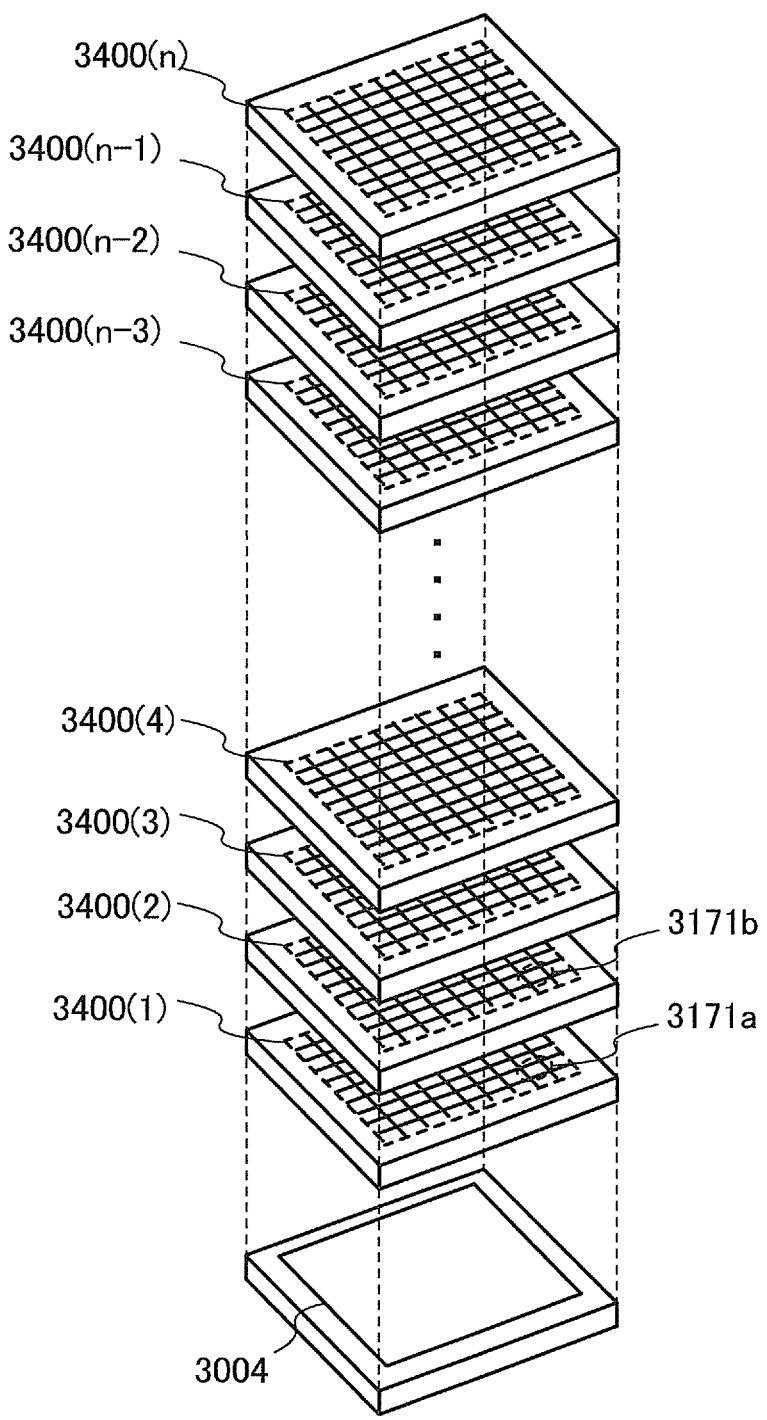
FIG. 15 illustrates an example of a memory device.

FIG. 15 is a perspective view of a memory device. The memory device illustrated in FIG. 15 includes a plurality of layers of memory cell arrays (memory cell arrays 3400(1) to 3400(n) (n is an integer greater than or equal to 2)) each including a plurality of memory cells as memory circuits in the upper portion, and a logic circuit 3004 in the lower portion which is necessary for operating the memory cell arrays 3400 (1) to 3400(n).

Figure 16:
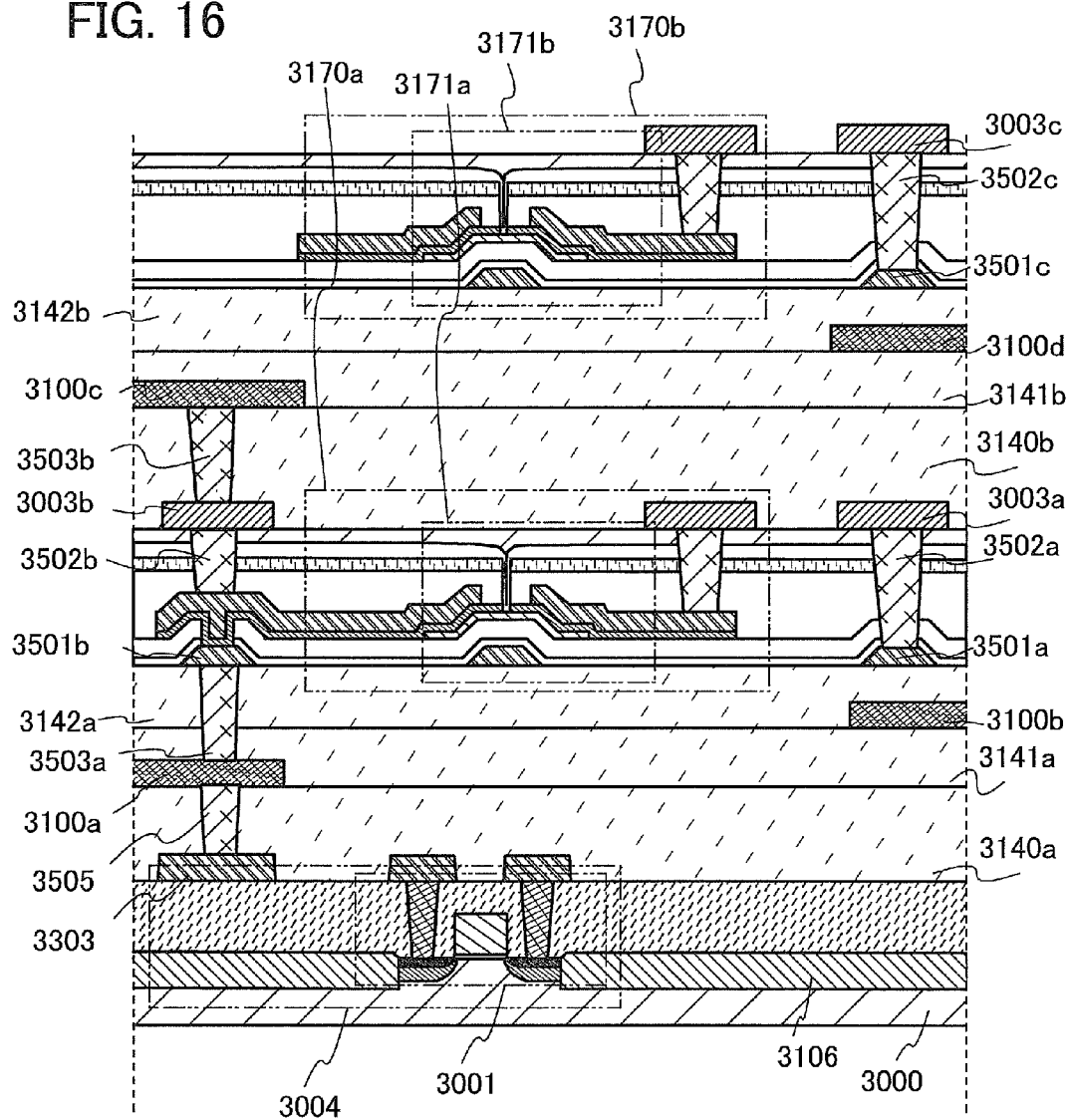
FIG. 16 illustrates an example of a memory device.

FIG. 16 is a partial enlarged view of the memory device illustrated in FIG. 15. FIG. 16 illustrates the logic circuit 3004, the memory cell array 3400(1), and the memory cell array 3400(2), and illustrates a memory cell 3170a and a memory cell 3170b as typical examples among the plurality of memory cells included in the memory cell array 3400(1) and the memory cell array 3400(2). The memory cell 3170a and the memory cell 3170b can have a configuration similar to the circuit configuration described in the above embodiment, for example.

Note that a transistor 3171a included in the memory cell 3170a is illustrated as a typical example. A transistor 3171b included in the memory cell 3170b is illustrated as a typical example. Each of the transistors 3171a and 3171b includes a channel formation region in an oxide semiconductor layer.

The structure of the transistor in which the channel formation region is formed in the oxide semiconductor layer is the same as the structure described in any of the other embodiments, and thus the description of the structure is omitted.

A conductive layer 3501a which is formed using the same layer as a gate electrode layer of the transistor 3171a is electrically connected to an electrode 3003a via an electrode 3502a. A conductive layer 3501c which is formed using the same layer as a gate electrode layer of the transistor 3171b is electrically connected to an electrode 3003c via an electrode 3502c.

The logic circuit 3004 includes a transistor 3001 in which a semiconductor material other than a wide band gap semiconductor is used for a channel formation region. The transistor 3001 can be a transistor obtained in such a manner that an element isolation insulating layer 3106 is provided on a substrate 3000 including a semiconductor material (e.g., silicon) and a region serving as the channel formation region is formed in a region surrounded by the element isolation insulating layer 3106. Note that the transistor 3001 may be a transistor obtained in such a manner that the channel formation region is formed in a semiconductor film such as a silicon film formed on an insulating surface or in a silicon film of an SOI substrate. A known structure can be used as the structure of the transistor 3001 and thus the description is omitted.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed. An insulating film 3141a is provided between the wiring 3100a and the wiring 3100b. An insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed. An insulating film 3141b is provided between the wiring 3100c and the wiring 3100d. An insulating film 3142b is provided between the wiring 3100d and the layers in which the transistor 3171b is formed.

The insulating films 3140a, 3141a, 3142a, 3140b, 3141b, and 3142b each function as an interlayer insulating film whose surface can be planarized.

The wirings 3100a, 3100b, 3100c, and 3100d enable electrical connection between the memory cells, electrical connection between the logic circuit 3004 and the memory cells, and the like.

An electrode 3303 included in the logic circuit 3004 can be electrically connected to a circuit provided in the upper portion.

For example, as illustrated in FIG. 16, the electrode 3303 can be electrically connected to the wiring 3100a via an electrode 3505. The wiring 3100a can be electrically connected to a conductive layer 3501b which is formed using the same layer as the gate electrode layer of the transistor 3171a via an electrode 3503a. In this manner, the wiring 3100a and the electrode 3303 can be electrically connected to the source or the drain of the transistor 3171a. The conductive layer 3501b can be electrically connected to an electrode 3003b via the source or the drain of the transistor 3171a and an electrode 3502b. The electrode 3003b can be electrically connected to the wiring 3100c via an electrode 3503b.

FIG. 16 illustrates an example in which the electrode 3303 and the transistor 3171a are electrically connected to each other via the wiring 3100a; however, one embodiment of the disclosed invention is not limited thereto. The electrode 3303 may be electrically connected to the transistor 3171a via the wiring 3100b, via both the wiring 3100a and the wiring 3100b, or via another electrode without using the wiring 3100a nor the wiring 3100b.

FIG. 16 illustrates the structure where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the number of wiring layers provided therebetween is not limited to two. One wiring layer or three or more wiring layers may be provided between the layers in which the transistor 3171a is formed and the layers in which the transistor 3001 is formed.

FIG. 16 illustrates the structure where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the number of wiring layers provided therebetween is not limited to two. One wiring layer or three or more wiring layers may be provided between the layers in which the transistor 3171b is formed and the layers in which the transistor 3171a is formed.

The structures, methods, and the like described in this embodiment can be combined as appropriate with any of the structures, methods, and the like described in the other embodiments.

Embodiment 8

Figure 17A:
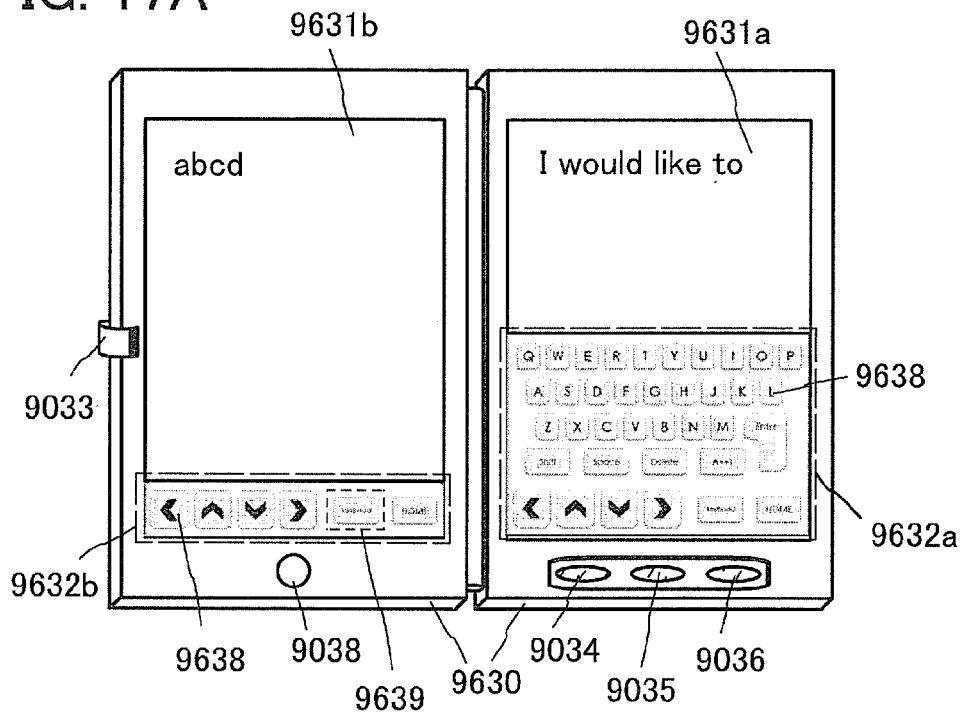
FIGS. 17A to 17C illustrate an example of an electronic device.
Figure 17B:
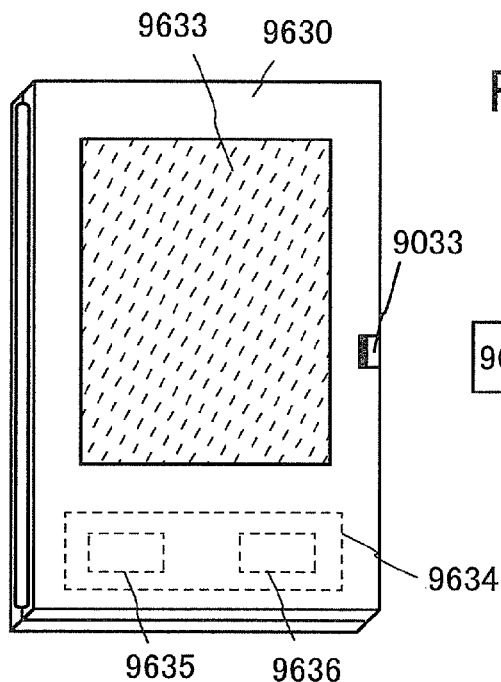
Figure 17C:
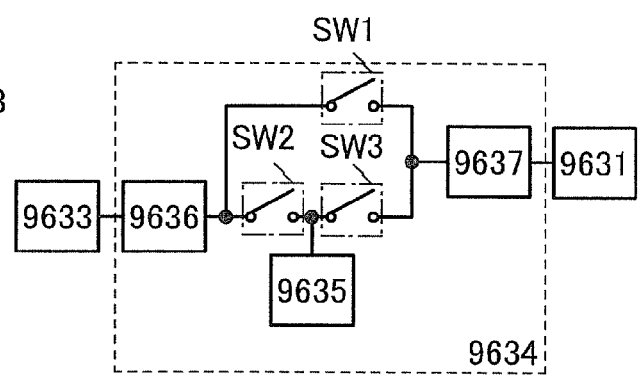

A semiconductor device disclosed in this specification can be applied to a variety of electronic devices (including game machines). Examples of electronic devices include a television device (also referred to as a television or a television receiver), a monitor of a computer or the like, a camera such as a digital camera or a digital video camera, a digital photo frame, a mobile phone, a portable game machine, a portable information terminal, an audio reproducing device, a game machine (such as a pachinko machine or a slot machine), a game console, and the like. FIGS. 17A to 17C illustrate a specific example of an electronic device.

FIGS. 17A and 17B illustrate a tablet terminal that can be folded. In FIG. 17A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of Embodiments 1 to 3 can be used for the display portion 9631a and the display portion 9631b, whereby the tablet terminal can be provided with high reliability.

Part of the display portion 9631a can be a touch panel region 9632a and data can be input when a displayed operation key 9638 is touched. Although a structure in which a half region in the display portion 9631a has only a display function and the other half region has a touch panel function is shown as an example, the display portion 9631a is not limited to the structure. The whole region in the display portion 9631a may have a touch panel function. For example, the display portion 9631a can display a keyboard in the whole region to be used as a touch panel, and the display portion 9631b can be used as a display screen.

Like the display portion 9631a, a touch panel region 9632b can be formed in part of the display portion 9631b. When a keyboard display switching button 9639 displayed on the touch panel is touched with a finger, a stylus, or the like, a keyboard can be displayed on the display portion 9631b.

Touch input can be performed concurrently on the touch panel regions 9632a and 9632b.

The display-mode switching button 9034 allows switching between a landscape mode and a portrait mode, color display and black-and-white display, and the like. With the power-saving-mode switching button 9036, the luminance of display can be optimized in accordance with the amount of external light at the time when the tablet is in use, which is detected with an optical sensor incorporated in the tablet. The tablet terminal may include another detection device such as a sensor for detecting inclination (e.g., a gyroscope or an acceleration sensor) in addition to the optical sensor.

Although the display portion 9631a and the display portion 9631b have the same display area in FIG. 17A, one embodiment of the present invention is not limited to this structure. The display portion 9631a and the display portion 9631b may have different areas or different display quality. For example, one of them may be a display panel that can display higher-definition images than the other.

In FIG. 17B, the tablet terminal is folded, and includes the housing 9630, a solar battery 9633, a charge and discharge control circuit 9634, a battery 9635, and a DCDC converter 9636. FIG. 17B illustrates an example in which the charge and discharge control circuit 9634 includes the battery 9635 and the DCDC converter 9636.

Since the tablet terminal can be folded, the housing 9630 can be closed when the tablet terminal is not used. Thus, the display portions 9631a and 9631b can be protected, thereby providing the tablet terminal with high endurance and high reliability for long-term use.

In addition, the tablet terminal illustrated in FIGS. 17A and 17B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently. The use of a lithium ion battery as the battery 9635 is advantageous in downsizing or the like.

The structure and operation of the charge and discharge control circuit 9634 illustrated in FIG. 17B are described with reference to a block diagram of FIG. 17C. FIG. 17C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 17B.

First, an example of operation in the case where power is generated by the solar battery 9633 using external light is described. The voltage of power generated by the solar battery 9633 is raised or lowered by the DCDC converter 9636 so that the power has a voltage for charging the battery 9635. When the display portion 9631 is operated with the power from the solar battery 9633, the switch SW1 is turned on and the voltage of the power is raised or lowered by the converter 9637 to a voltage needed for operating the display portion 9631. In addition, when display on the display portion 9631 is not performed, the switch SW1 is turned off and a switch SW2 is turned on so that charge of the battery 9635 may be performed.

Here, the solar battery 9633 is shown as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

EXPLANATION OF REFERENCE

400: substrate, 401: gate electrode layer, 402: gate insulating layer, 403: oxide semiconductor layer, 405: low-resistance material layer, 405a: low-resistance material layer, 405b: low-resistance material layer, 406: first protective layer, 407: second protective layer, 407a: third protective layer, 407b: fourth protective layer, 420: transistor, 421: transistor, 430: capacitor, 431: transistor, 432: insulating layer, 436: base insulating layer, 440: transistor, 441: transistor, 451: oxygen doping, 453: resist, 454: conductive layer, 454a: first conductive layer, 454b: second conductive layer, 455: resist, 474a: wiring layer, 474b: wiring layer, 485: wiring protective layer, 485a: first wiring protective layer, 485b: second wiring protective layer, 495: hard mask layer, 3000: substrate, 3001: transistor, 3003a: electrode, 3003b: electrode, 3003c: electrode, 3004: logic circuit, 3100a: wiring, 3100b: wiring, 3100c: wiring, 3100d: wiring, 3106: element isolation insulating layer, 3140a: insulating film, 3140b: insulating film, 3141a: insulating film, 3141b: insulating film, 3142a: insulating film, 3142b: insulating film, 3170a: memory cell, 3170b: memory cell, 3171a: transistor, 3171b: transistor, 3200: transistor, 3202: transistor, 3204: capacitor, 3208: electrode, 3210a: conductive layer, 3210b: conductive layer, 3212: electrode, 3214: electrode, 3216: wiring, 3220: insulating layer, 3222: insulating layer, 3223: insulating layer, 3223a: insulating layer, 3224: insulating layer, 3303: electrode, 3400 (1): memory cell array, 3400(2): memory cell array, 3400 (n): memory cell array, 3501a: conductive layer, 3501b: conductive layer, 3501c: conductive layer, 3502a: electrode, 3502b: electrode, 3502c: electrode, 3503a: electrode, 3503b: electrode, 3505: electrode, 9033: clip, 9034: button, 9035: power button, 9036: button, 9038: operation button, 9630: housing, 9631: display portion, 9631a: display portion, 9631b: display portion, 9632a: region, 9632b: region, 9633: solar battery, 9634: charge and discharge control circuit, 9635: battery, 9636: DCDC converter, 9637: converter, 9638: operation key, 9639: button.

This application is based on Japanese Patent Application serial no. 2011-282438 filed with Japan Patent Office on Dec. 23, 2011 and Japanese Patent Application serial no. 2011-282511 filed with Japan Patent Office on Dec. 23, 2011, the entire contents of which are hereby incorporated by reference.

The invention claimed is:

1. A method for manufacturing a semiconductor device, comprising the steps of:
   forming a gate electrode layer;
   forming a gate insulating layer over the gate electrode layer;
   forming a semiconductor layer over the gate insulating layer;
   forming a first conductive layer over the semiconductor layer;
   forming a second conductive layer over the first conductive layer so that the first conductive layer is exposed in a region which overlaps with a channel formation region of the semiconductor layer;
   forming a protective layer over the second conductive layer;
   forming a hard mask layer over the protective layer;
   forming a resist pattern over the hard mask layer, the resist pattern including an opening which overlaps with the semiconductor layer;
   etching the hard mask layer using the resist pattern;
   etching the protective layer using the hard mask layer; and
   etching the first conductive layer using the hard mask layer.

2. The method for manufacturing the semiconductor device according to claim 1,
   wherein the semiconductor layer includes an oxide including indium and zinc.

3. The method for manufacturing the semiconductor device according to claim 1, wherein the opening in the resist pattern is formed by an electron beam.

4. The method for manufacturing the semiconductor device according to claim 1, wherein the hard mask layer comprises amorphous silicon.

5. The method for manufacturing the semiconductor device according to claim 1, wherein a channel length of a transistor including the semiconductor layer is greater than or equal to 20 nm and less than or equal to 100 nm.

6. The method for manufacturing the semiconductor device according to claim 1, wherein a length of the semiconductor layer in a channel length direction is larger than a length of the gate electrode layer in the channel length direction.

7. The method for manufacturing the semiconductor device according to claim 1, further comprising the step of planarizing the gate insulating layer before forming the semiconductor layer.

8. The method for manufacturing the semiconductor device according to claim 1, further comprising the step of planarizing the protective layer before forming the hard mask layer.

9. A method for manufacturing a semiconductor device, comprising the steps of:
   forming a gate electrode layer;
   forming a gate insulating layer over the gate electrode layer;
   forming a semiconductor layer over the gate insulating layer;
   forming a first conductive layer over the semiconductor layer;
   forming a second conductive layer over the first conductive layer;
   forming a protective layer over the second conductive layer;
   forming a first resist pattern over the protective layer, the first resist pattern including a first opening;
   etching the protective layer and the second conductive layer using the first resist pattern;
   forming, after the step of etching, a second resist pattern over the first conductive layer and the protective layer, the second resist pattern including a second opening in a region which overlaps with the semiconductor layer; and
   etching the first conductive layer using the second resist pattern.

10. The method for manufacturing the semiconductor device according to claim 9,
    wherein the semiconductor layer includes an oxide including indium and zinc.

11. The method for manufacturing the semiconductor device according to claim 9, wherein the second opening is formed by an electron beam.

12. The method for manufacturing the semiconductor device according to claim 9, wherein a channel length of a transistor including the semiconductor layer is greater than or equal to 20 nm and less than or equal to 100 nm.

13. The method for manufacturing the semiconductor device according to claim 9, wherein a length of the semiconductor layer in a channel length direction is larger than a length of the gate electrode layer in the channel length direction.

14. The method for manufacturing the semiconductor device according to claim 9, further comprising the step of planarizing the gate insulating layer before forming the semiconductor layer.

15. A method for manufacturing a semiconductor device, comprising the steps of:
    forming an oxide semiconductor layer;
    forming a first conductive layer over the oxide semiconductor layer;
    forming a second conductive layer over the first conductive layer so that the first conductive layer is exposed in a region which overlaps with a channel formation region of the oxide semiconductor layer;
    forming a protective layer over the second conductive layer;
    forming a hard mask layer over the protective layer;
    forming a resist pattern over the hard mask layer, the resist pattern including an opening which overlaps with the oxide semiconductor layer;
    etching the hard mask layer using the resist pattern;
    etching the protective layer using the hard mask layer; and
    etching the first conductive layer using the hard mask layer.

16. The method for manufacturing the semiconductor device according to claim 15,
    wherein the oxide semiconductor layer includes indium and zinc.

17. The method for manufacturing the semiconductor device according to claim 15, wherein the opening in the resist pattern is formed by an electron beam.

18. The method for manufacturing the semiconductor device according to claim 15, wherein the hard mask layer comprises amorphous silicon.

19. The method for manufacturing the semiconductor device according to claim 15, wherein a channel length of a transistor including the oxide semiconductor layer is greater than or equal to 20 nm and less than or equal to 100 nm.

20. The method for manufacturing the semiconductor device according to claim 15, further comprising the step of planarizing the protective layer before forming the hard mask layer.

* * * * *